US010593875B2

(12) United States Patent
Lai et al.

(10) Patent No.: US 10,593,875 B2
(45) Date of Patent: Mar. 17, 2020

(54) SELF-ALIGNED 3D MEMORY WITH CONFINED CELL

(71) Applicant: MACRONIX INTERNATIONAL CO., LTD., Hsinchu (TW)

(72) Inventors: Erh-Kun Lai, Tarrytown, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/009,901

(22) Filed: Jun. 15, 2018

(65) Prior Publication Data

US 2019/0386213 A1    Dec. 19, 2019

(51) Int. Cl.
*H01L 27/24* (2006.01)
*H01L 45/00* (2006.01)

(52) U.S. Cl.
CPC ...... *H01L 45/1246* (2013.01); *H01L 27/2427* (2013.01); *H01L 27/2463* (2013.01); *H01L 27/2481* (2013.01); *H01L 45/06* (2013.01); *H01L 45/1233* (2013.01); *H01L 45/1608* (2013.01); *H01L 45/1675* (2013.01)

(58) Field of Classification Search
CPC ............. H01L 27/2427; H01L 27/2463; H01L 27/2481; H01L 45/06; H01L 45/1233; H01L 45/124; H01L 45/1246; H01L 45/1608; H01L 45/1675; H01L 45/1682; H01L 45/1691
See application file for complete search history.

(56) References Cited

U.S. PATENT DOCUMENTS

| 6,579,760 | B1 | 6/2003 | Lung |
| 8,163,593 | B2 * | 4/2012 | Raghuram .......... H01L 27/2409 257/530 |
| 8,916,414 | B2 | 12/2014 | Cheng et al. |
| 9,537,093 | B1 | 1/2017 | Lai et al. |
| 9,659,998 | B1 | 5/2017 | Lung |
| 9,793,323 | B1 | 10/2017 | Lung et al. |
| 2007/0158633 | A1 * | 7/2007 | Lai .......................... H01L 45/06 257/4 |
| 2010/0155687 | A1 | 6/2010 | Reyes et al. |

(Continued)

FOREIGN PATENT DOCUMENTS

CN  107482034 A  12/2017
TW  200802809 A  1/2008

(Continued)

OTHER PUBLICATIONS

Czubatyj, et al. "Invited Paper: Thin-Film Ovonic Threshold Switch: Its Operation and Application in Modern Integrated Circuits," Electron. Mater. Lett.vol. 8, No. 2, Apr. 29, 2012, 11 pages.

(Continued)

*Primary Examiner* — Stephen W Smoot
(74) *Attorney, Agent, or Firm* — Haynes Beffel & Wolfeld LLP

(57) ABSTRACT

A plurality of memory cells in a cross-point array in which the memory cell stacks in the cross-points include a switch element, a conductive barrier layer, and a memory cell in series, and having sides aligned within the cross-point area of the corresponding cross-point. The memory cells in the stacks include confinement spacers within the cross-point area having outside surfaces on a pair of opposing sides of the stack, and a body of programmable resistance memory material confined between inside surfaces of the spacers.

20 Claims, 16 Drawing Sheets

(56) References Cited

U.S. PATENT DOCUMENTS

| | | | |
|---|---|---|---|
| 2010/0163818 A1* | 7/2010 | Lee | H01L 27/2427 257/2 |
| 2011/0254126 A1 | 10/2011 | Kreupl et al. | |
| 2012/0068136 A1* | 3/2012 | Park | H01L 45/06 257/1 |
| 2014/0246646 A1 | 9/2014 | Sasago et al. | |
| 2015/0084156 A1 | 3/2015 | Ravasio et al. | |
| 2017/0250339 A1* | 8/2017 | Sim | H01L 45/1233 |
| 2017/0288138 A1* | 10/2017 | Lee | H01L 27/2409 |
| 2018/0033826 A1* | 2/2018 | Choi | G11C 13/0004 |

FOREIGN PATENT DOCUMENTS

| | | |
|---|---|---|
| TW | 201203640 A | 1/2012 |
| TW | 201801300 A | 1/2018 |
| TW | 201803168 A | 1/2018 |

OTHER PUBLICATIONS

Kau, et al., "A stackable cross point phase change memory," 2009 International Electron Devices Meeting, Baltimore MD, Dec. 7-9, 2009, pp. 27.1.1- 27.1.4.

Kim, et al. "A phase change memory cell with metallic surfactant layer as a resistance drift stabilizer," Dec. 9-11, 2013, pp. 30.7.1-30.7.4.

Li et al., "Evaluation of SiO2 Antifuse in a 3D-OTP Memory," IEEE Transaction on Device and Materials Reliability, vol. 4, No. 3, Sep. 2004, 6 pages.

Malventano, "Breaking: Intel and Micron Announce 3D XPoint Technology—1000x Faster Than NAND" Jul. 28, 2015, 4 pages, found at https://www.pcper.com/news/Storage/Breaking-Intel-and-Micron-announce-3D-XPoint-Technology-1000x-Faster-NAND.

Sasago, et al., "Cross-point phase change memory with 4F2 cell size driven by low-contact-resistivity poly-Si diode," 2009 Symp. on VLSI Technology, Jun. 16-18, 2009, 2 pages.

Vatto, et al, "Analyzing Intel-Micron 3D XPoint: The Next Generation Non-Volatile Memory," Jul. 31, 2015, 16 pages, found at https://www.anandtech.com/show/9470/intel-and-micron-announce-3d-xpoint-nonvolatile-memory-technology-1000x-higher-performance-endurance-than-nand.

TW Office Action from Application No. 107132128, dated Jun. 13, 2019, 4 pages (plus English translation).

* cited by examiner

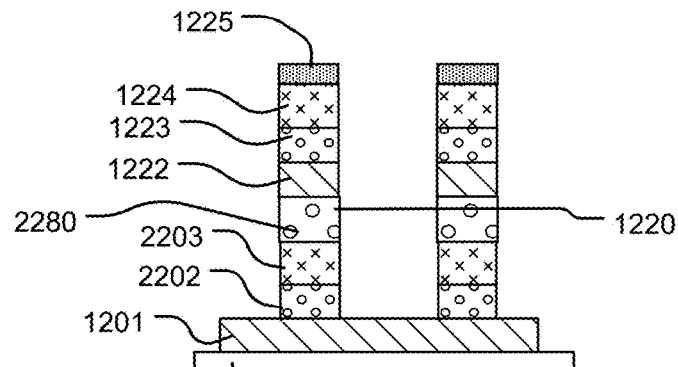
Fig. 9B C-C
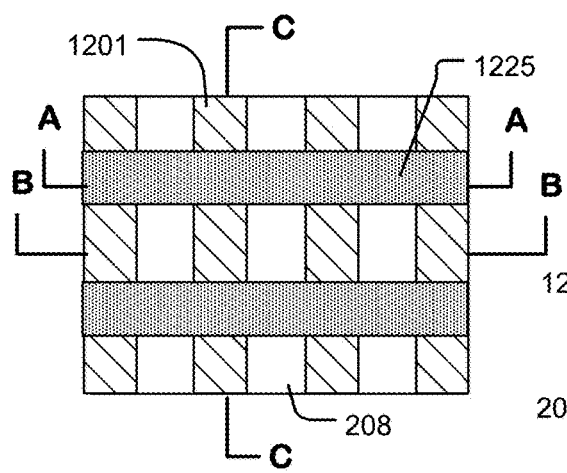
Fig. 9A
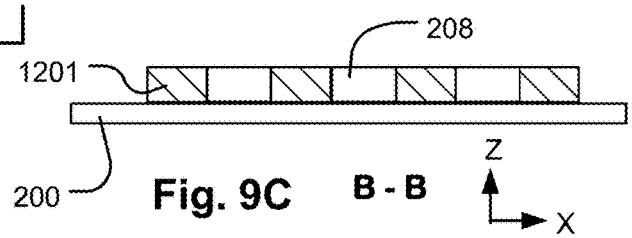
Fig. 9C B-B
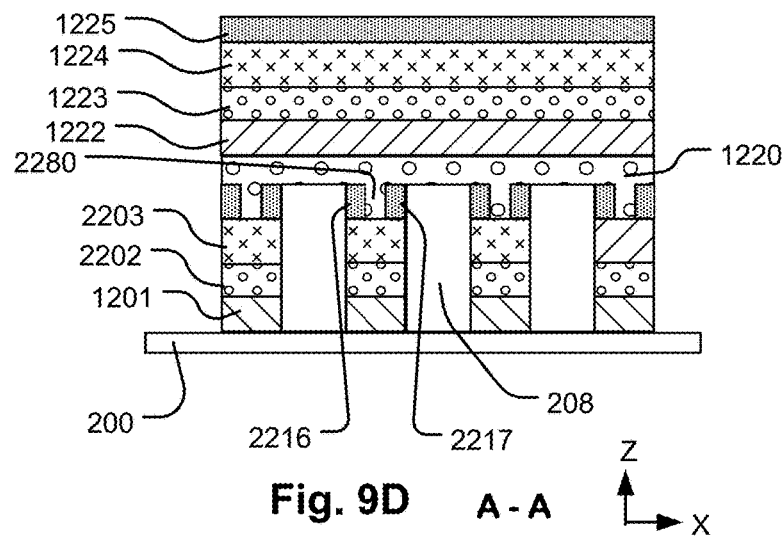
Fig. 9D A-A

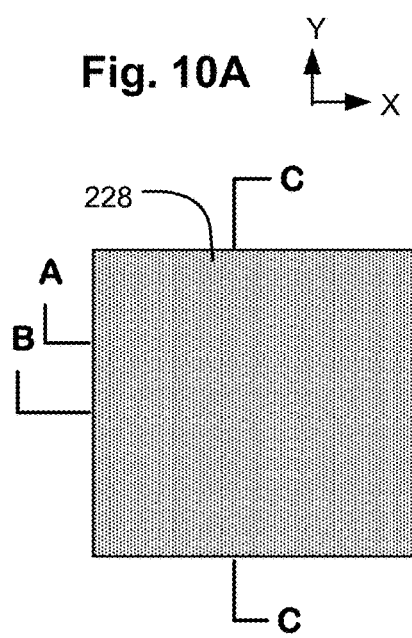
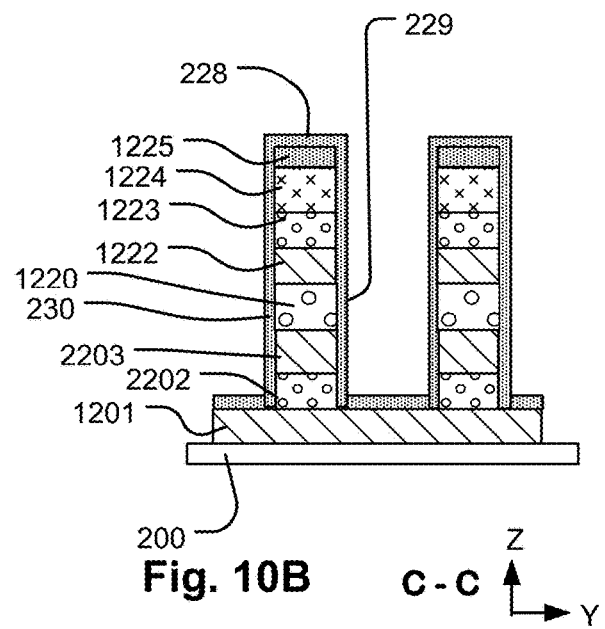
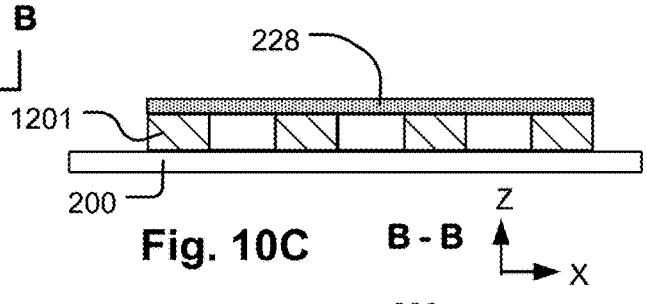
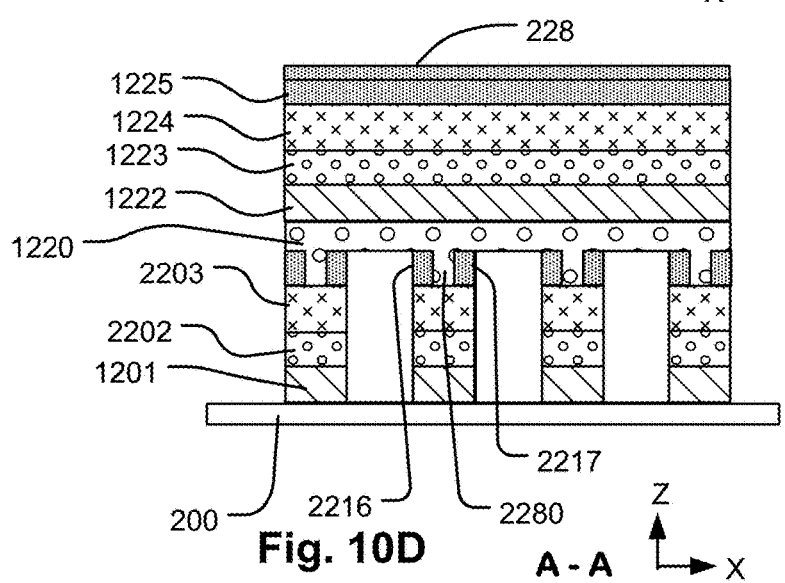
Fig. 10A
Fig. 10B
Fig. 10C
Fig. 10D

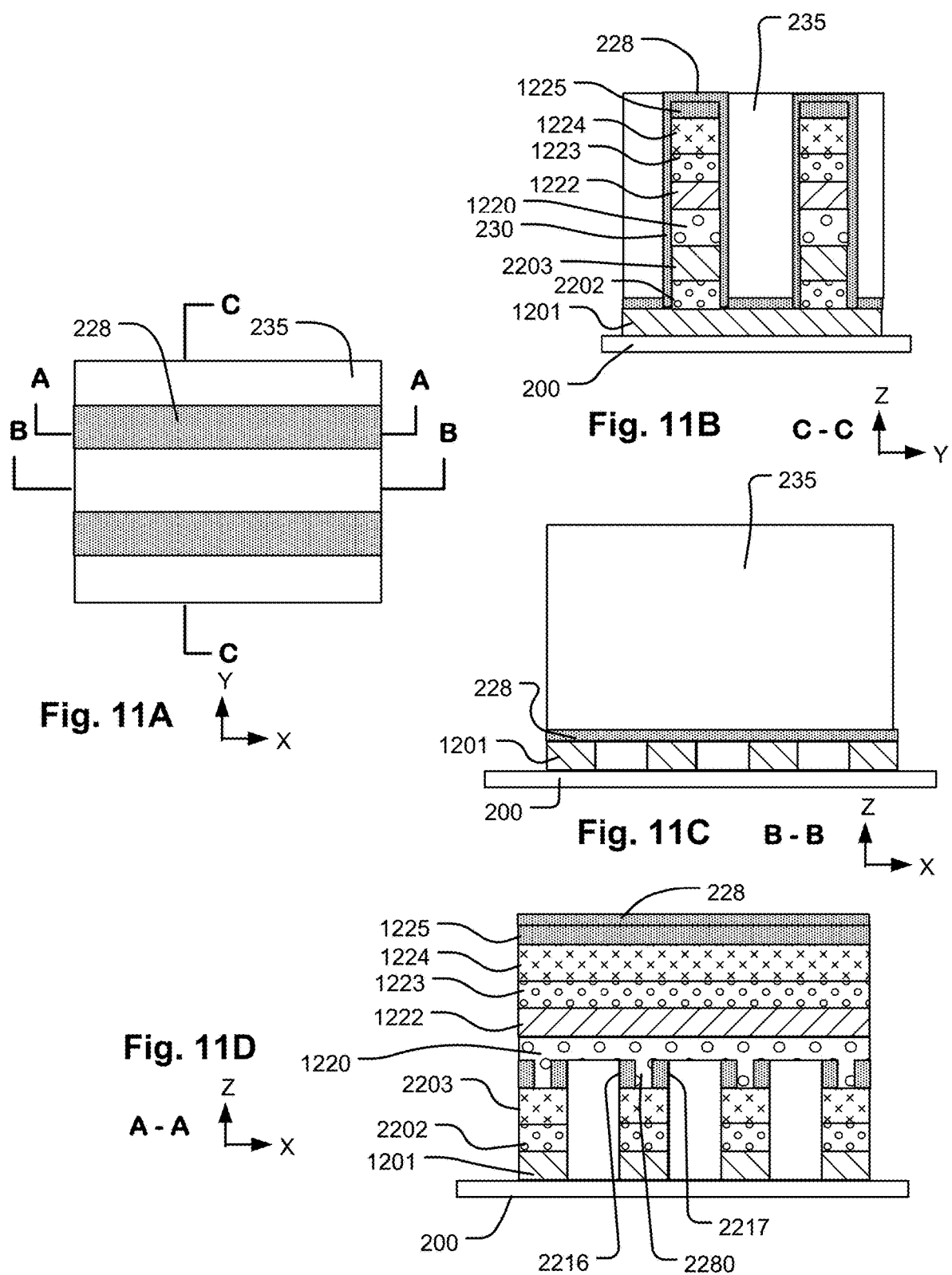

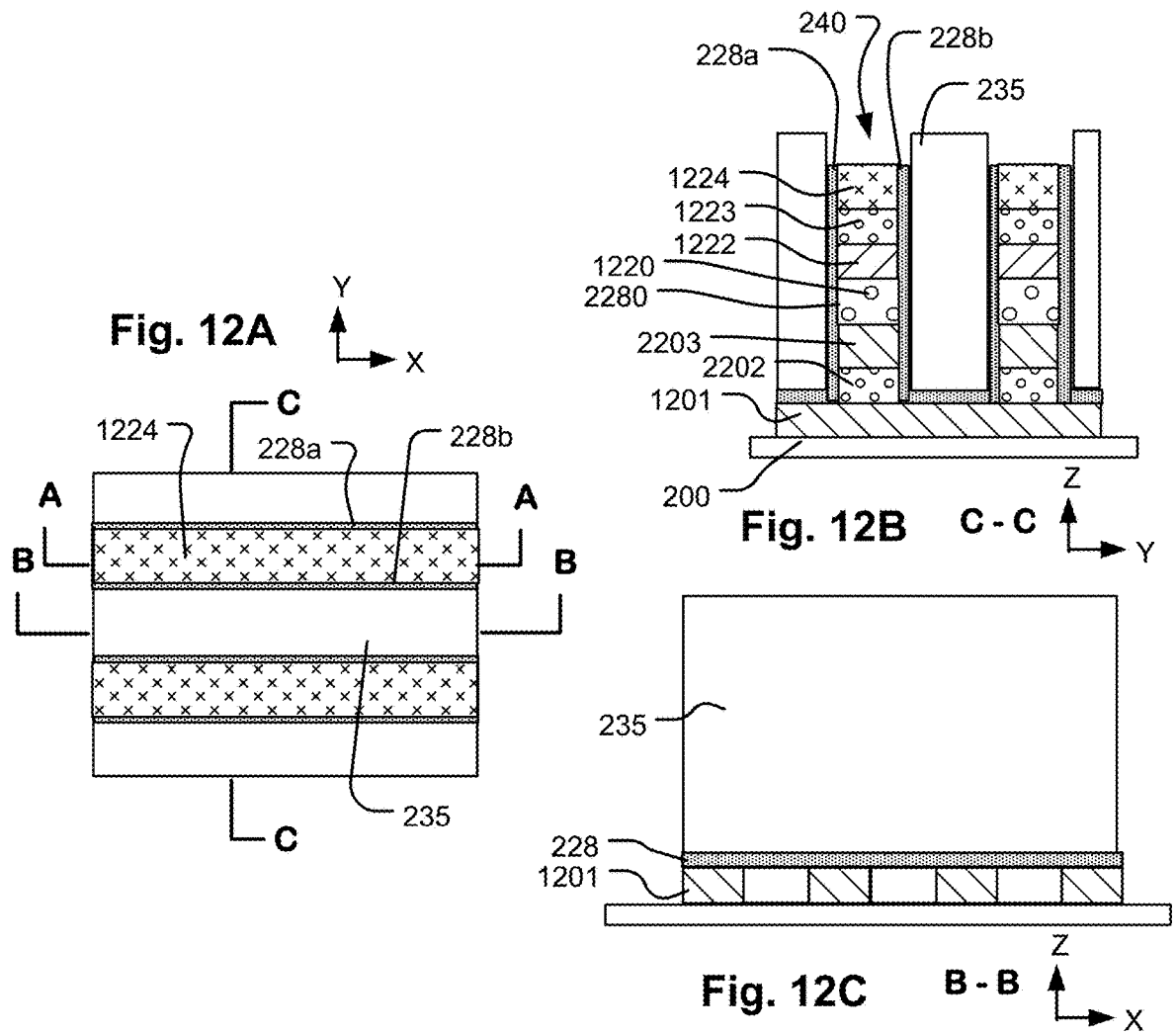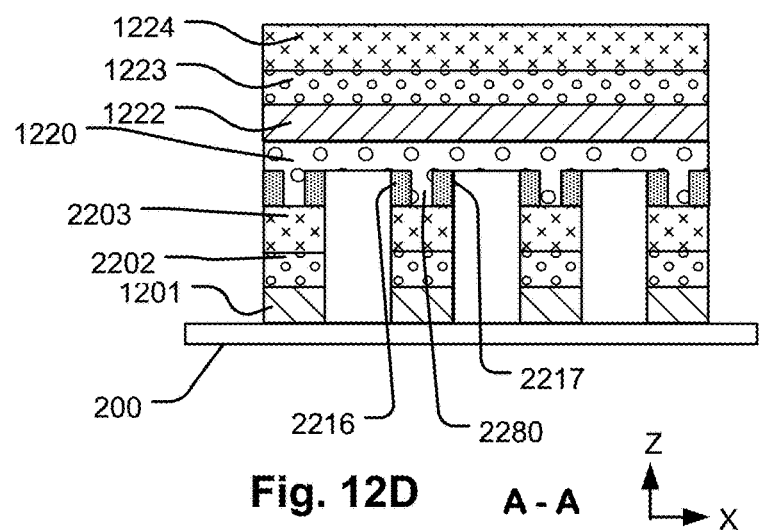

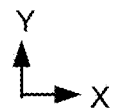
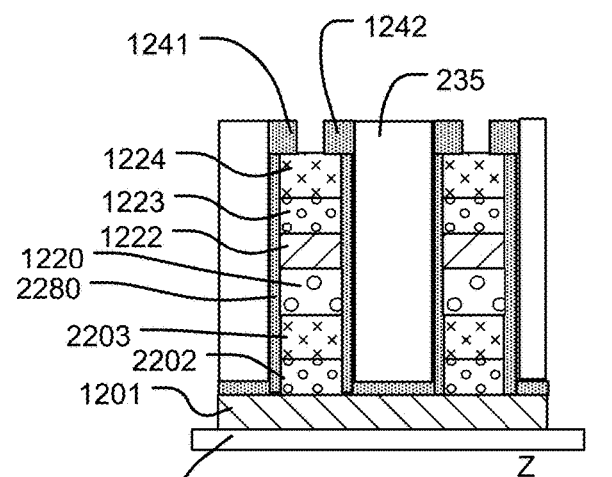
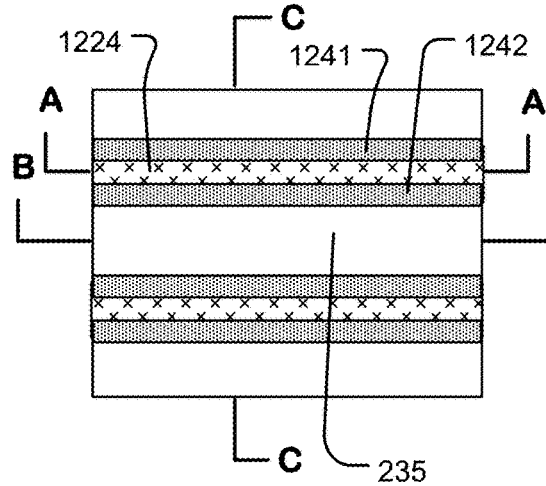
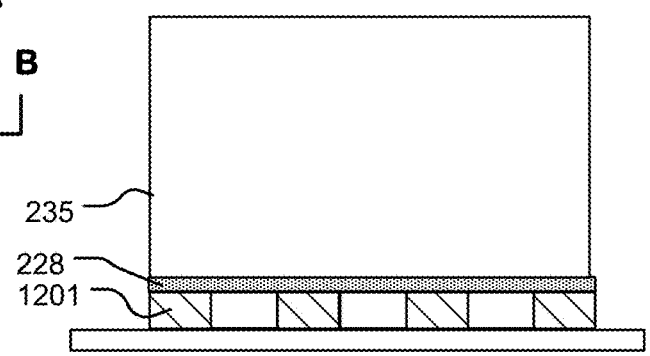
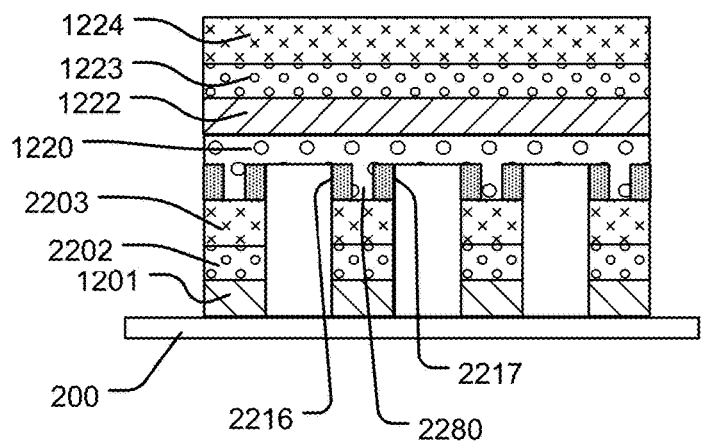

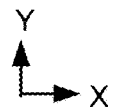
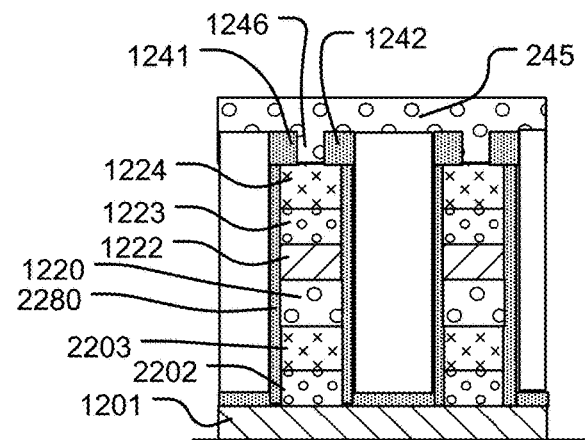
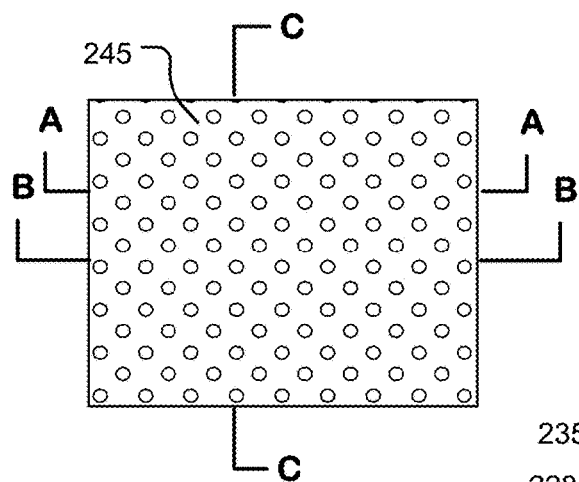
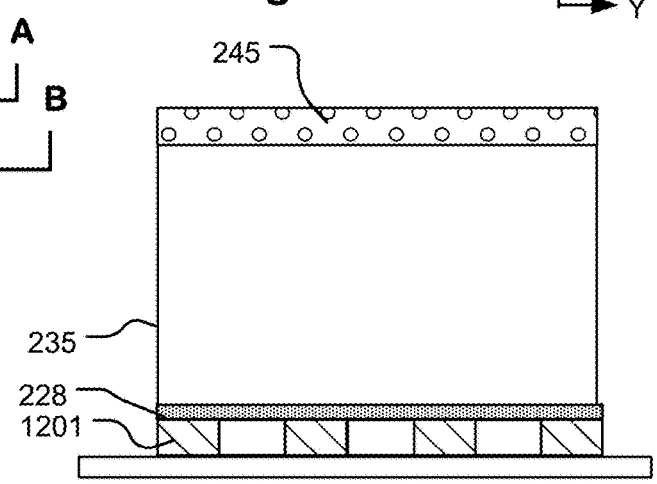
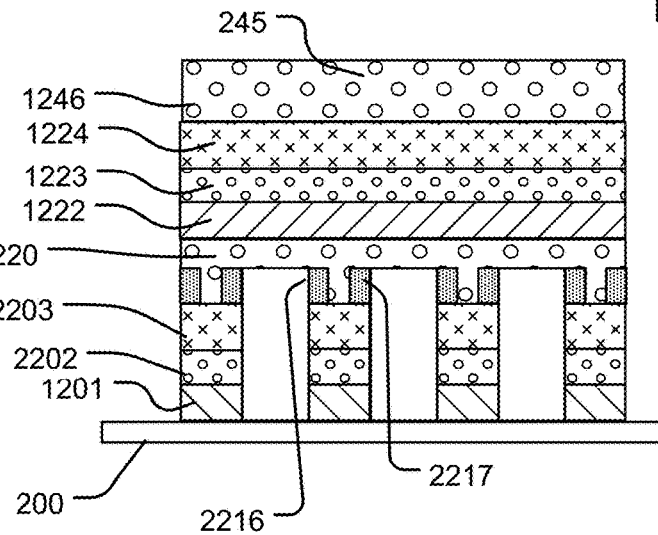

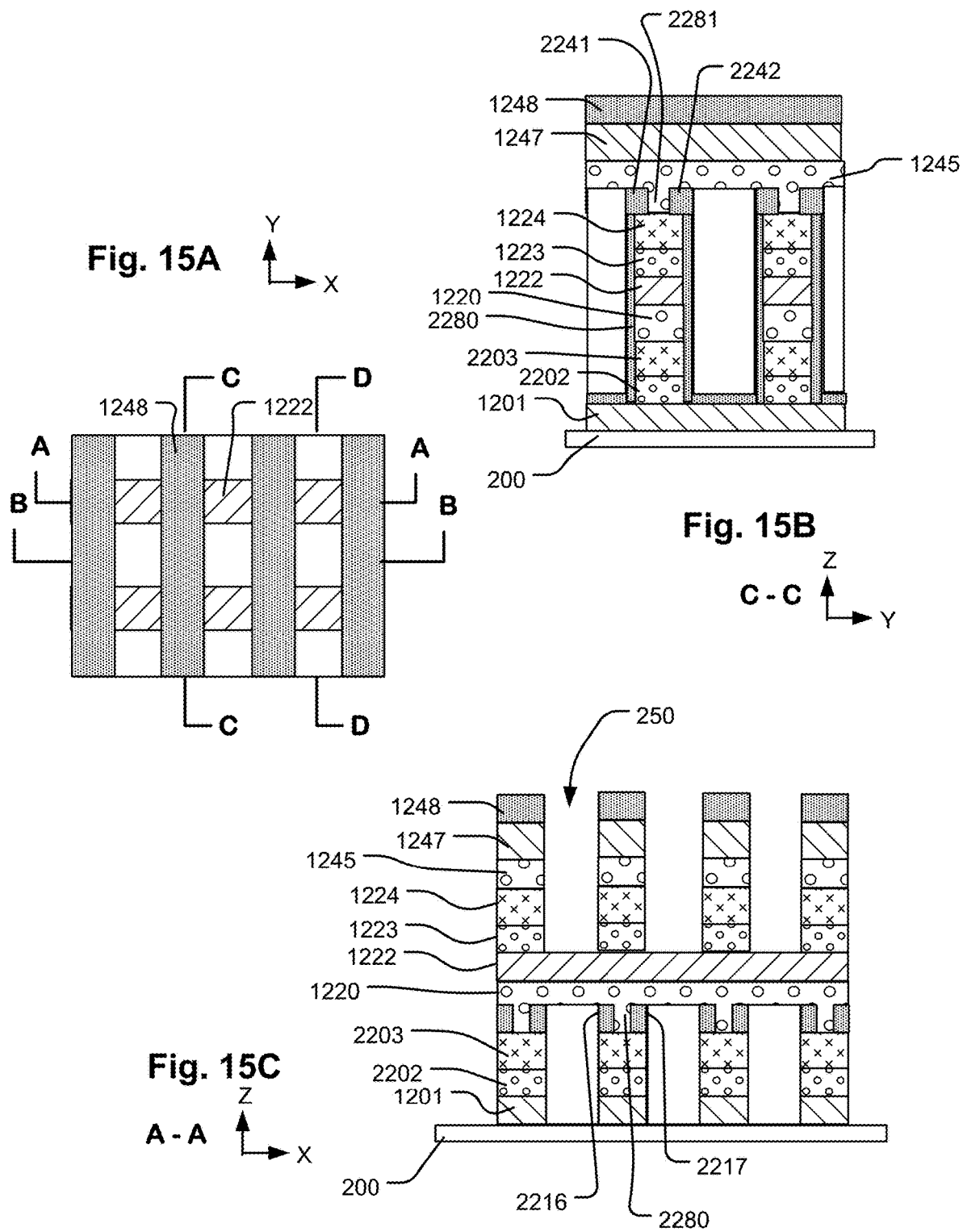

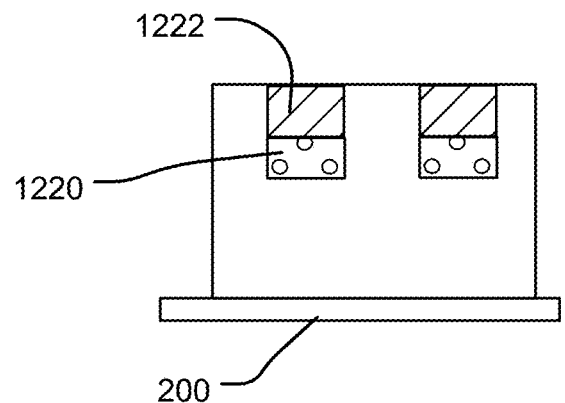
Fig. 15D D - D 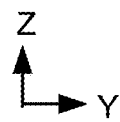
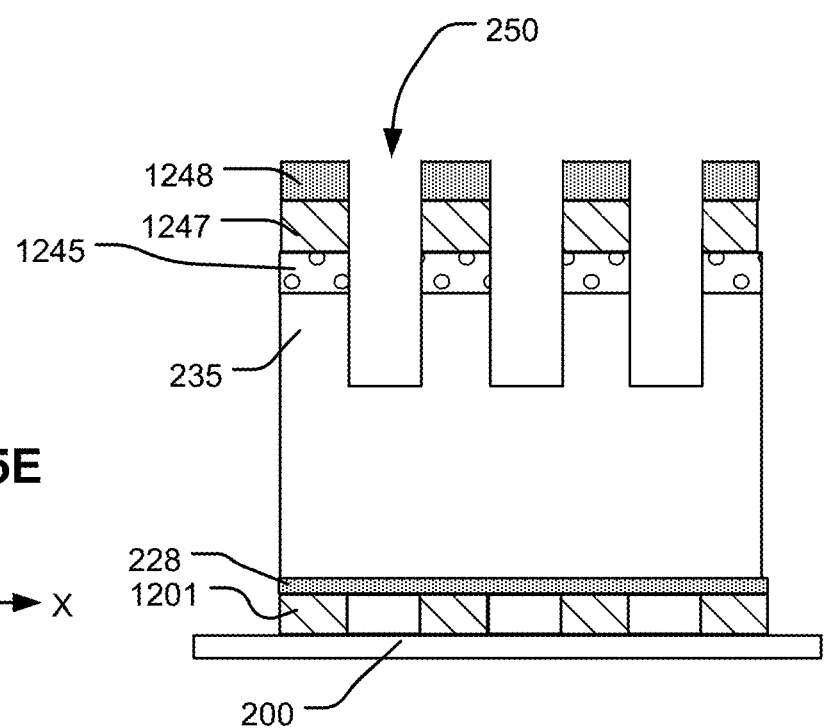
Fig. 15E
B - B 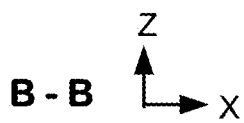

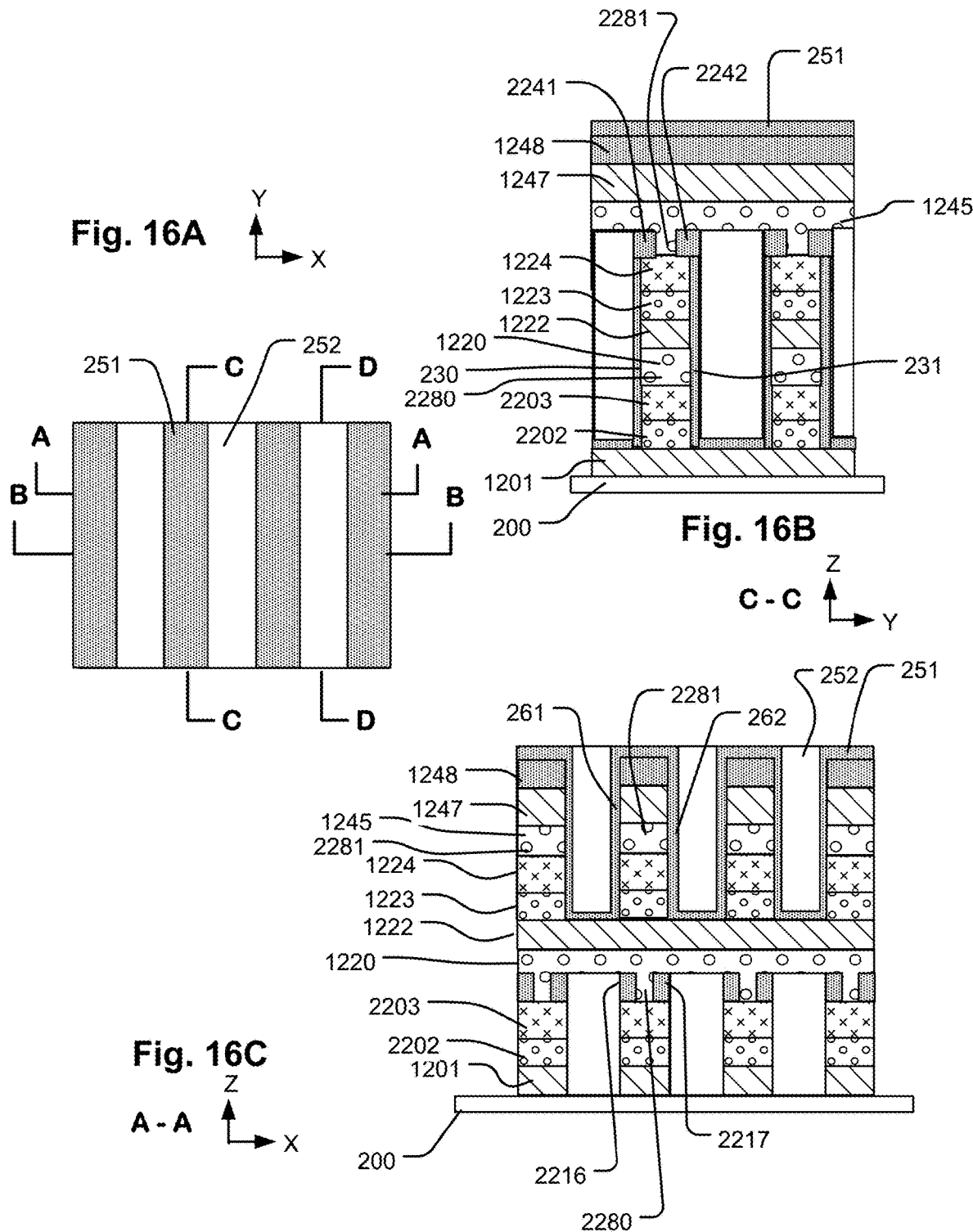

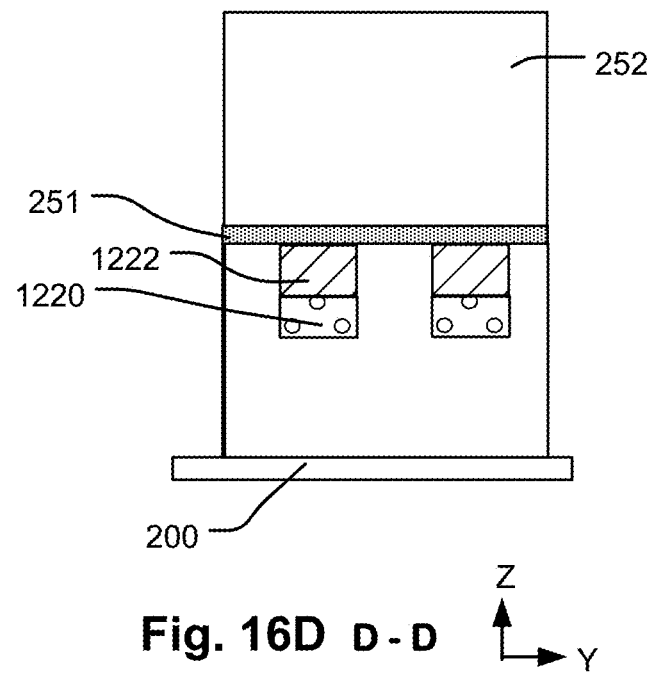
Fig. 16D  D-D
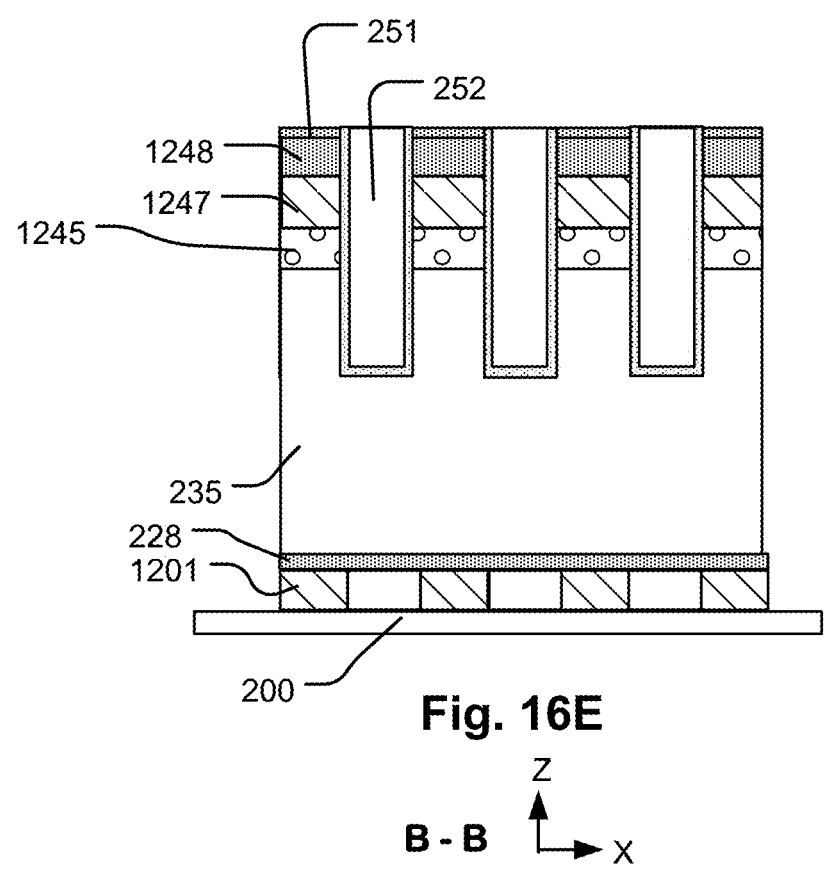
Fig. 16E
B-B

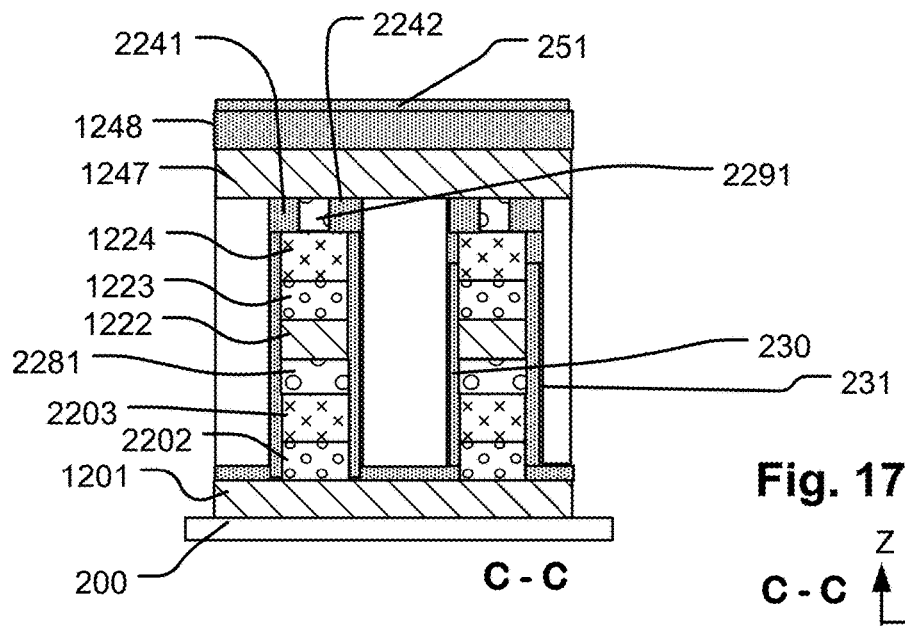
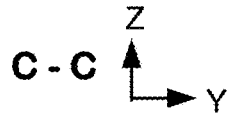
Fig. 17A
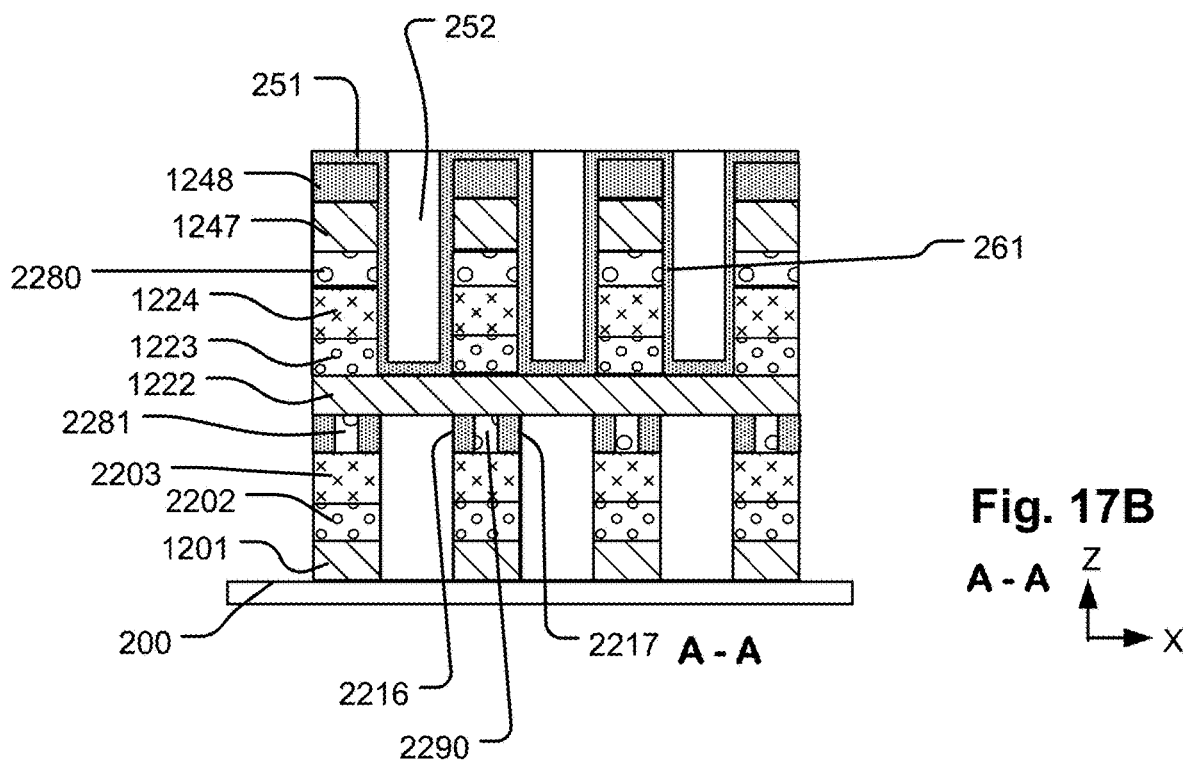
Fig. 17B

SELF-ALIGNED 3D MEMORY WITH CONFINED CELL

BACKGROUND

Parties to a Joint Research Agreement

International Business Machines Corporation, a New York corporation, and Macronix International Corporation, Ltd., a Taiwan corporation, are parties to a Joint Research Agreement.

TECHNICAL FIELD

The technology described herein relates to integrated circuit memory technologies, including technologies using programmable resistance memory materials, including phase change materials, in 3D cross-point architectures, and methods for manufacturing such devices.

DESCRIPTION OF RELATED ART

Many three dimensional (3D) memory technologies using phase change material, and other programmable resistance materials, have been proposed. For example, Li et al., "Evaluation of $SiO_2$ Antifuse in a 3D-OTP Memory," IEEE Transactions on Device and Materials Reliability, Vol. 4, No. 3, September 2004, describes a polysilicon diode and an anti-fuse arranged as a memory cell. Sasago et al., "Cross-Point Phase Change Memory with $4F^2$ Cell Size Driven by Low-Contact-Resistivity Poly-Si Diode," 2009 Symposium on VLSI Technology Digest of Technical Papers, pages 24-25, describes a polysilicon diode and a phase change element arranged as a memory cell. Kau et al., "A Stackable Cross Point Phase Change Memory," IEDM09-617, (2009) pages 27.1.1 to 27.1.4, describes a memory post including an ovonic threshold switch OTS as an access device with a phase change element. See also, Lung, U.S. Pat. No. 6,579,760 entitled SELF-ALIGNED, PROGRAMMABLE PHASE CHANGE MEMORY, issued Jun. 17, 2003.

However, difficulties in manufacturing have limited success of 3D structures for programmable resistance memory, including phase change memory. For example, the cross-point structure defines the dimensions of the memory elements based on the widths of the word lines and bit lines that define the cross-section area.

It is desirable to provide a memory structure that is more readily manufacturable for high density structures, while satisfying data retention and endurance requirements.

SUMMARY

In embodiments described herein, memory cell stacks in a cross-point architecture have dimensions defined by the cross-point area of the word lines and bit lines, and include a switch, or steering device, such as an ovonic threshold switch, in series with a body of programmable resistance material, such as phase change material. The programmable resistance memory material in a memory cell stack in the cross-point architecture is disposed in a self-aligned, confined space within the stack having an area smaller than the cross-point area.

One aspect of the technology includes a cross-point memory, having a plurality of first conductors in a first patterned layer and a plurality of second conductors in a second patterned layer; and an array of memory cell stacks disposed between the first conductors and the second conductors. Each memory cell stack in the array comprises a switch in electrical series with programmable resistance material. The memory cell stack comprises a switch element, a conductive barrier layer, and a memory cell, in series, and having sides aligned within the cross-point area of the corresponding cross-point, the memory cell including confinement spacers within the cross-point area having outside surfaces on a pair of opposing sides of the stack, and a body of programmable resistance memory material confined between inside surfaces of the spacers.

In some embodiments, each memory cell stack can include a layer of confinement material having outside surfaces on a second pair of opposing sides of the stack within the cross-point area at the corresponding cross-point.

Also, in some embodiments, the programmable resistance memory material of the memory cells lines the second conductors in the plurality of second conductors, and is in contact with the bodies of programmable resistance memory material in the memory cell stacks, and separating the bodies of programmable resistance memory material from the second conductors at the corresponding cross-point, forming a mushroom cell structure.

Also, in some embodiments, the spacers have an upper surface, and the body of programmable resistance memory material contacts the second conductor at the corresponding cross-point at a level co-planar with the upper surface of the spacers, forming a confined pillar cell structure.

Another aspect of the technology is a method of manufacturing an integrated circuit including a memory cell like that described above.

Other features, aspects and advantages of the technology described herein can be understood with reference to the figures, the detailed description and the claims set out below.

BRIEF DESCRIPTION OF THE DRAWINGS

FIGS. 9A-9D are X-Y layout, Y-Z cross-section, and first and second X-Z cross-section views of a next stage in the example manufacturing process.

FIGS. 10A-10D are X-Y layout, Y-Z cross-section, and first and second X-Z cross-section views of a next stage in the example manufacturing process.

FIGS. 11A-11D are X-Y layout, Y-Z cross-section, and first and second X-Z cross-section views of a next stage in the example manufacturing process.

FIGS. 12A-12D are X-Y layout, Y-Z cross-section, and first and second X-Z cross-section views of a next stage in the example manufacturing process.

FIGS. 13A-13D are X-Y layout, Y-Z cross-section, and first and second X-Z cross-section views of a next stage in the example manufacturing process.

FIGS. 14A-14D are X-Y layout, Y-Z cross-section, and first and second X-Z cross-section views of a next stage in the example manufacturing process.

FIGS. 15A-15E are X-Y layout, Y-Z cross-section, first Y-Z cross-section, first X-Z cross-section, second Y-Z cross-section and second X-Z cross-section views of the sub-assembly at a next stage in the example manufacturing process.

FIGS. 16A-16E are X-Y layout, first Y-Z cross-section, first X-Z cross-section, second Y-Z cross-section and second X-Z cross-section views of the sub-assembly at a next stage in the example manufacturing process.

FIGS. 17A and 17B are Y-Z cross-section, and X-Z cross-section views of a manufacturing stage for an alternative process corresponding to FIGS. 16B and 16C for the first process.

DETAILED DESCRIPTION

Detailed descriptions of embodiments of programmable resistance memory devices and of methods of manufacturing such devices are provided with reference to FIGS. 1-18.

Figure 1:
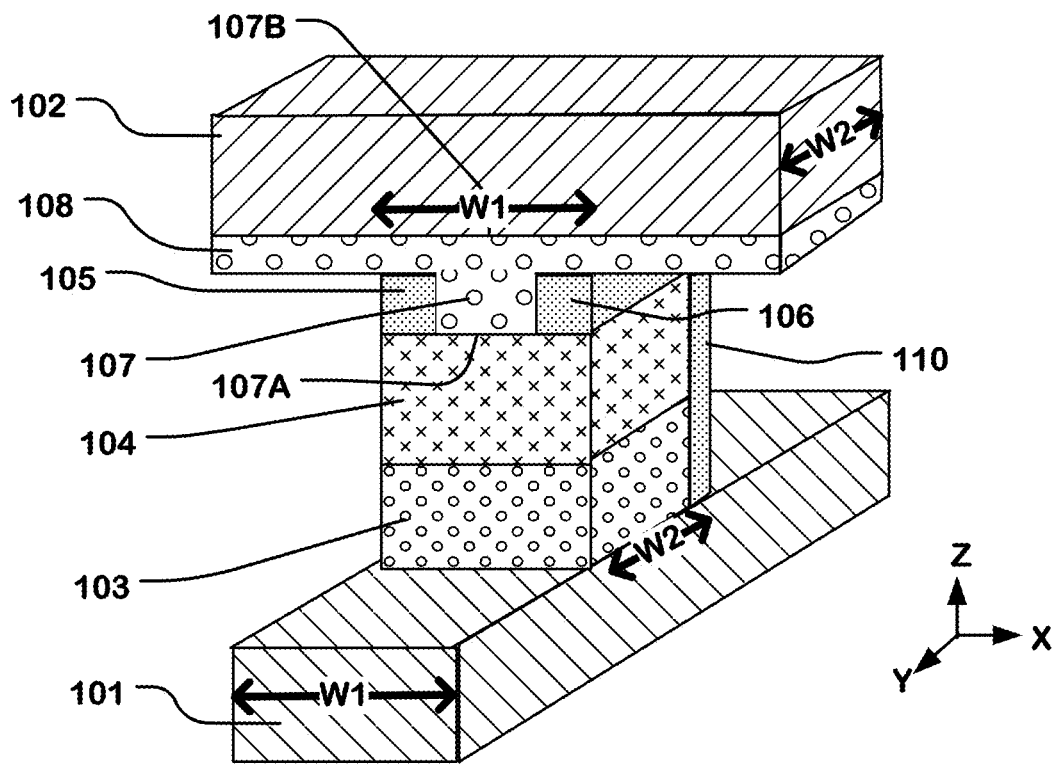
FIG. 1 is a perspective view of an embodiment of a memory cell having a confined memory element in a cross-point array.

FIG. 1 is a perspective view of a phase change memory cell suitable for use in a cross-point array. A first conductor 101 can be configured as a bit line, and a second conductor 102 can be configured as a word line. A memory cell stack is disposed between first conductor 101 and second conductor 102 and comprises a switch in series with a body 107 of phase change material. The switch comprises an ovonic threshold switching layer 103 and a diffusion barrier layer 104. The stack has a first end (top end in the illustration) including the body 107 of phase change material in contact for current flow connection with the second conductor 102, and a second end (bottom end in the illustration) including the switching layer 103 in contact for current flow connection with first conductor 101.

In another example, the switch and phase change material are inverted, so that the phase change material is in contact with first conductor 101 and the switching layer 103 is in contact with second conductor 102.

The phase change material can comprise chalcogenide-based materials, for example $Ga_xSb_yTe_z$, $Ge_xSb_yTe_z$, $Ga_wGe_xSb_yTe_z$, $Ge_wGe_xSb_yTe_z$, $Ag_wIn_xSb_yTe_z$, $Sn_wGe_xSb_y$-$Te_z$, $Se_wGe_xSb_yTe_z$ and $S_wGe_xSb_yTe_z$. The phase change material comprises the first element, for example tellurium (Te), and the second element, for example antimony (Sb). The phase change material can have additives, for example nitrogen, silicon, oxygen, silicon oxide, and silicon nitride. In one embodiment, the phase change material is $Ge_xSb_yTe_z$, with a silicon oxide additive, the first element is Te and the second element is Sb.

Switching layer 103 can comprise a chalcogenide combination selected for operation as an ovonic threshold switch, and can include one or more elements selected from the group comprising arsenic (As), tellurium (Te), antimony (Sb), selenium (Se), germanium (Ge), silicon (Si), oxygen (O) and nitrogen (N). In one example, switching layer 103 can have a thickness of about 10 nm to about 40 nm, preferably about 30 nm. Czubatyj et al., "Thin-Film Ovonic Threshold Switch: Its Operation and Application in Modern Integrated Circuits," Electronic Materials Letters, Vol. 8, No. 2 (2012), pages 157-167, describes applications and electrical characteristics of the thin-film Ovonic Threshold Switch (OTS). In other embodiments, other current steering devices can be utilized, including diodes, transistors, tunneling dielectric layers, and so on.

Diffusion barrier layer 104 comprises a material or combination of materials selected to provide adequate adhesion between switching layer 103 and the phase change material, and blocks movement of impurities from the pillar into the switch and vice versa. The diffusion barrier can be comprised of conductive material with a thickness of about 3 to about 30 nm, preferably about 5 nm. Appropriate materials for diffusion barrier layer 104 may comprise a metal nitride, for example, titanium nitride (TiN), tantalum nitride (TaN), tungsten nitride (WN), molybdenum nitride (MoN), titanium silicon nitride (TiSiN), titanium aluminum nitride (TiAlN). In addition to metal nitrides, conductive materials, such as titanium carbide (TiC), tungsten carbide (WC), graphite (C), other carbon (C) forms, titanium (Ti), molybdenum (Mo), tantalum (Ta), titanium silicide (TiSi), tantalum silicide (TaSi), and titanium tungsten (TiW), can be used for diffusion barrier layer 104.

The materials chosen for first conductor 101 and second conductor 102 can comprise a variety of metals, metal-like materials, and doped semiconductors, and combinations thereof. First conductor 101 and second conductor 102 can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi) and other materials. In one example, the conductors 101 and 102 comprise a tri-layer structure including TiN, W and TiN.

In the embodiment of FIG. 1, the first conductor 101 has a width W1 that is defined by a patterning technology, such as photolithography, so that it is as small as practical given the manufacturing technologies and operational characteristics. Likewise, the second conductor 102 has a width W2 that is defined by a patterning technology so that it is as small as practical. At the cross-point of the first conductor 101 and the second conductor 102, a cross-point area is defined. A memory cell stack is disposed within a cylindrical region at the cross-point between the first and second conductors 101, 102, the cross-section of which is defined by the cross-point area (W1×W2) and the etching processes aligned by the sides of the first and second conductors. The memory cell stack can be self-aligned with the first and second conductors in that no additional alignment technique is applied other than the etching and patterning techniques used to form the first conductor 101 and the second conductor 102.

The memory cell stack includes a switch element that comprises the ovonic threshold switch material in layer 103, a conductive barrier layer that comprises the barrier material in layer 104, and a memory cell in series.

The memory cell includes confinement spacers 105, 106 having inside and outside surfaces. The confinement spacers 105, 106 have outside surfaces aligned within the cross-point area on a first pair of opposing sides of the memory cell stack (left and right sides in the illustration), and a body of programmable resistance material confined between inside surfaces of the spacers.

The confinement spacers 105 and 106 with the body 107 of phase change material provide a confined element of programmable resistance material with an area of contact 107A with the barrier layer 104 that is substantially less than the cross-point area of the memory cell stack at the corresponding cross-point.

In alternative embodiments, an additional confinement spacer or pair of confinement spacers can be included on the forward and backward sides as well, further reducing the volume of the confined body of phase change material aligned within the memory cell stack.

Also, in this embodiment, the memory cell includes confinement liners on a second pair of opposing sides of the memory cell stack (forward and backward sides in the illustration). The confinement liners comprise layers of confinement material—only the backside confinement liner that comprises a layer of confinement material 110 is illustrated, as the front side confinement liner is removed for the purposes of revealing the underlying structure. The confinement liners (e.g. layer of confinement material 110) having inside surfaces in contact with the body of programmable resistance material in this embodiment, and outside surfaces facing fill material in the trenches between the cross-points. The body of programmable resistance material is thus confined both by the confinement spacers 105, 106, and the confinement liners (e.g. layer of confinement material 110) aligned with the cross-point area of the memory cell stack.

In this embodiment, the confinement spacers 105, 106, and the layer of confinement material 110, comprise silicon nitride. Other materials can be used depending on process environments and other factors, including dielectrics such as hafnium oxide HfOx, zirconium oxide ZrOx, aluminum oxide AlOx, silicon oxynitride SiOxNy, and silicon oxide SiOx. Performance and reliability testing has shown superior data when using SiN, over SiOx, for a confined phase change material memory element.

In this embodiment, the body 107 of phase change material comprises an extension of, or extends from, a programmable resistance memory material liner 108 of the same material or similar material that underlies the second conductor 102 and separates the second conductor 102 from direct contact with the confined body 107 of programmable resistance material. The memory cell in the memory cell stack makes contact 107B with the second conductor 102 through the liner 108 along at least a substantial part of the length of the second conductor 102 which is greater than the area of contact 107A. As a result, the memory cell in the memory cell stack, combined with the programmable resistance memory material liner 108, form a "mushroom" style memory element, for the current density in the programmable resistance memory material during operation of the memory cell is greater in the confined area of the body 107 of programmable resistance material. The active region of the phase change material, that is the region that changes solid phase in operation, can extend into the liner 108 in a mushroom style memory element.

Figure 2:
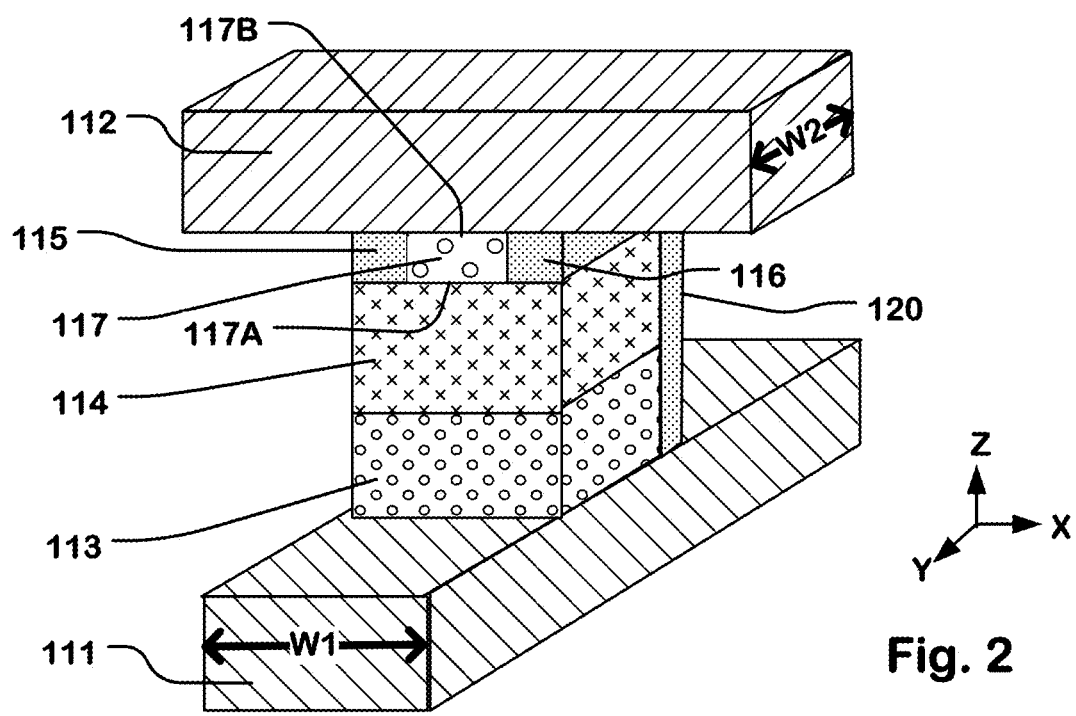
FIG. 2 is a perspective view of another embodiment of a memory cell having a confined memory element in a cross-point array.

FIG. 2 illustrates an alternative embodiment using a confined "pillar" memory cell structure. In this embodiment, the first conductor 111 has a width W1 that is defined by a patterning technology, such as photolithography, so that it is as small as practical given the manufacturing technologies. Likewise, the second conductor 112 has a width W2 that is defined by a patterning technology so that it is as small as practical. At the cross-point of the first conductor 111 and the second conductor 112, a cross-point area is defined. A memory cell stack is disposed within a cylindrical volume at the cross-point, the cross-section of which is defined by the cross-point area (W1×W2), and can be self-aligned as discussed above in connection with FIG. 1.

The memory cell stack includes a switch element that comprises an ovonic threshold switch material in layer 113, a conductive barrier layer that comprises the barrier material in layer 114, and a memory cell in series. The memory cell has sides aligned with the cross-point area of the cross-point of conductors 111 and 112.

The memory cell includes confinement spacers 105, 106 having inside and outside surfaces. The confinement spacers 105, 106 have outside surfaces aligned within the cross-point area on a first pair of opposing sides of the memory cell stack (left and right sides in the illustration), and a body of programmable resistance material confined between inside surfaces of the spacers.

The confinement spacers 105 and 106 with the body 107 of phase change material provide a confined element of programmable resistance material with an area of contact 107A with the barrier layer 104 that is substantially less than the cross-point area of the memory cell stack at the corresponding cross-point.

In alternative embodiments, an additional confinement spacer or pair of confinement spacers can be included on the forward and backward sides as well, further reducing the volume of the confined body of phase change material aligned within the memory cell stack.

Also, in this embodiment, the memory cell includes confinement liners on a second pair of opposing sides of the memory cell stack (forward and backward sides in the illustration). The confinement liners comprise layers of confinement material—only the backside confinement liner that comprises a layer of confinement material 110 is illustrated, as the front side confinement liner is removed for the purposes of revealing the underlying structure. The confinement liners (e.g. layer of confinement material 110) have inside surfaces in contact with the body of programmable resistance material in this embodiment, and outside surfaces facing fill material in the trenches between the cross-points. The body of programmable resistance material is thus confined both by the confinement spacers 105, 106, and the confinement liners (e.g. layer of confinement material 110) aligned with the cross-point area of the memory cell stack.

In this embodiment, the confinement spacers 115, 116 and the layer of confinement material 120 comprise silicon nitride. Other dielectric materials can be used as discussed above.

In this embodiment, the body of programmable resistance memory material 117 comprises a pillar of material that makes contact 117B with the second conductor at a level coplanar with the top of the spacers 115, 116, with a contact area that can be similar to the area of contact 117A. As a result, the memory cell in the memory cell stack combined with the programmable resistance memory material liner 118 form a "pillar" style memory element. In the pillar structure, the volume of the active region can be almost the same as the volume of the phase change material.

Figure 3:
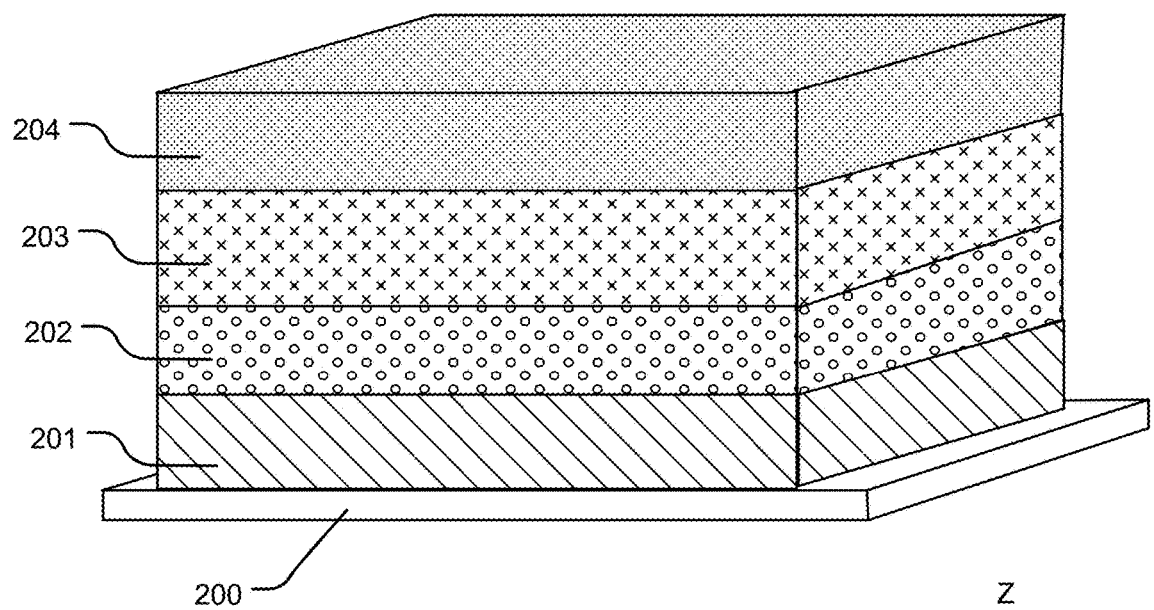
FIGS. 3-5 are 3D perspective views illustrating stages of an example of a manufacturing process for a 3D cross-point memory.
Figure 4:
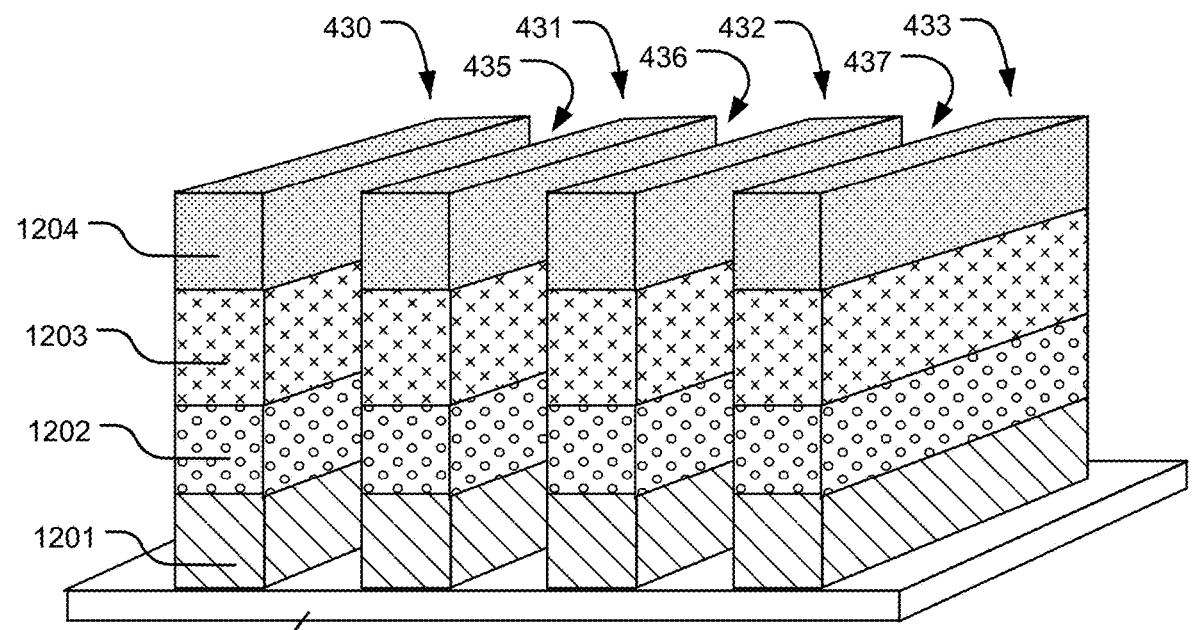
Figure 5:
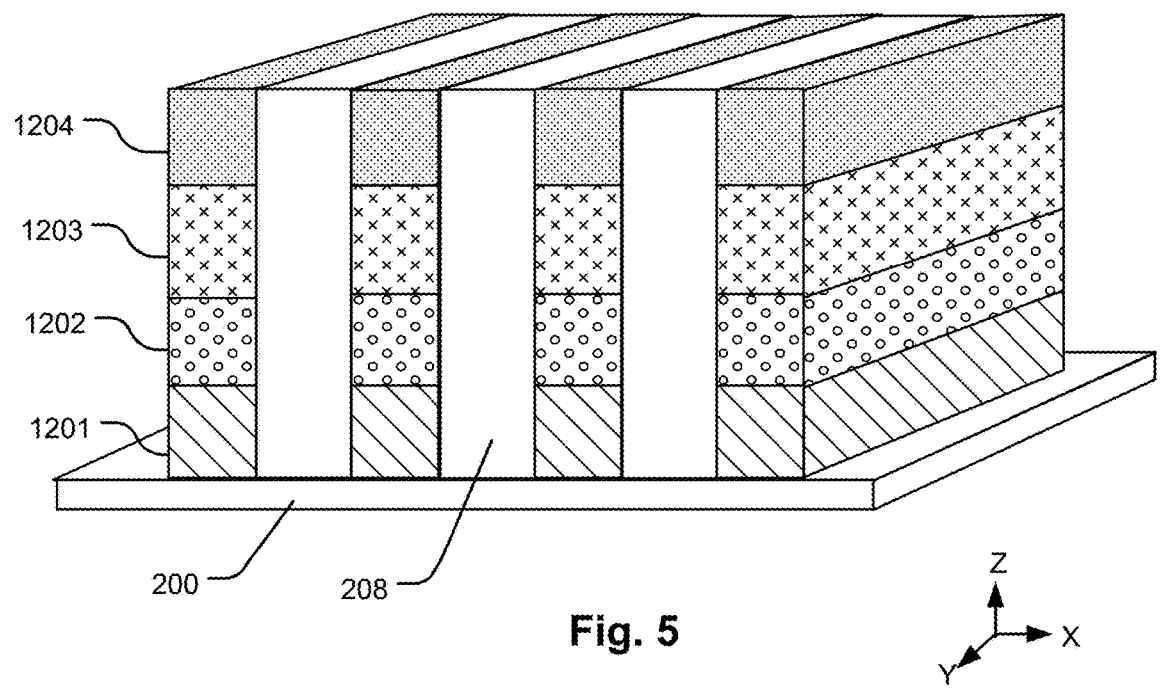

FIGS. 3 through 16E are a sequence of figures illustrating stages of an example process flow for manufacturing an array of memory cells like that of FIG. 1. FIGS. 3 through 5 are shown in 3D perspective view. Figures thereafter in the sequence include 2D layout and cross-section views that show the structure for simplicity. Reference numerals used in this set of figures are generally applied throughout.

FIG. 3 illustrates a stage in the manufacturing process after forming a first stack of materials 200-204. Base layer 200 provides an insulating substrate that can be formed of a buried oxide or silicon nitride layer on an integrated circuit substrate, or other type of insulating base. There can be circuitry underlying the base layer 200 in some embodiments. The process involves depositing materials of a first conductor layer 201, materials of a switch element in a switching layer 202, materials of a conductive barrier layer 203, and then a hard mask layer 204.

The materials of the first conductor layer 201 can comprise a multilayer combination of titanium nitride, tungsten and titanium nitride as mentioned above. Other combinations of materials can be utilized. These materials can be deposited using for example one or more of chemical vapor deposition (CVD), physical vapor deposition (PVD), and atomic layer deposition (ALD) processes.

The materials of the switching layer 202 can comprise materials for an ovonic threshold switch element, such as those described above. In embodiments in which the switching element material comprises phase change material, the switching layer 202 can be deposited by physical vapor deposition (PVD), sputtering, or a magnetron-sputtering method with source gas(es) of Ar, $N_2$, and/or He, etc. at the pressure of 1 mTorr~100 mTorr, for example. Alternatively, the layer also can be formed using chemical vapor deposition (CVD) and atomic layer deposition (ALD).

The materials of the conductive barrier layer 203 can comprise a variety of barrier materials selected in accordance with the programmable resistance memory element. For a phase change memory element, a suitable barrier material can be titanium nitride. Alternative embodiments can comprise carbon varieties, including carbon nanotubes and graphene. Also, material such as silicon carbide and other conductive barrier materials can be utilized.

Materials of the hard mask layer 204 can comprise silicon nitride, or other suitable hard mask material selected in accordance with the etch chemistry being applied.

FIG. 4 illustrates a stage in manufacturing after patterning the stack of materials to define a plurality of trenches 435, 436, 437 between stacked lines 430, 431, 432, 433 (extending in the Y-direction in the illustration). This first patterning step stops on the underlying base layer 200. Each of the stacked lines (e.g. 430), includes a first conductor 1201 in the patterned first conductor layer 201, a line 1202 of the materials of a switching layer 202, a line of the conductive barrier material 1203 from the conductive barrier layer 203, and a line 1204 of the hard mask material from the hard mask layer 204.

FIG. 5 illustrates a stage after forming an insulating fill (e.g. 208) in the trenches (435, 436, 437 of FIG. 4). The insulating fill can be formed by a deposition of silicon oxide, or other insulating fill materials suitable for the cross-point architecture. Other low dielectric constant (low-κ) dielectrics can used as will. It is preferred that the fill material be different than the confinement material. In this way, end point detection for the etching, including REI etching, of the confinement spacers can be facilitated, resulting in better confinement spacer profiles. Also, use of a low-κ material can help reduce capacitance, enabling better operating speeds. The fill step can be implemented using a spin-on process, CVD, ALD, PVD, LPCVD, and HDPCVD, for example. After depositing the insulating fill, a chemical mechanical polishing step can be applied that stops on the lines 1204 of hard mask material in the hard mask layer 204, providing a smooth, planar surface on which to build the following layers.

Figure 6A:
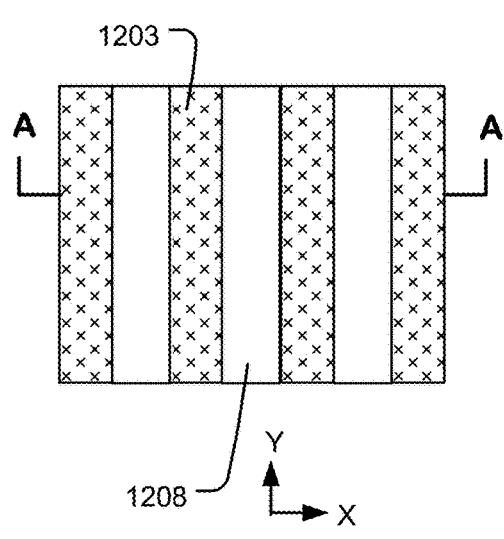
FIGS. 6A-6B are X-Y layout and X-Z cross-section views of a next stage in the example manufacturing process.
Figure 6B:
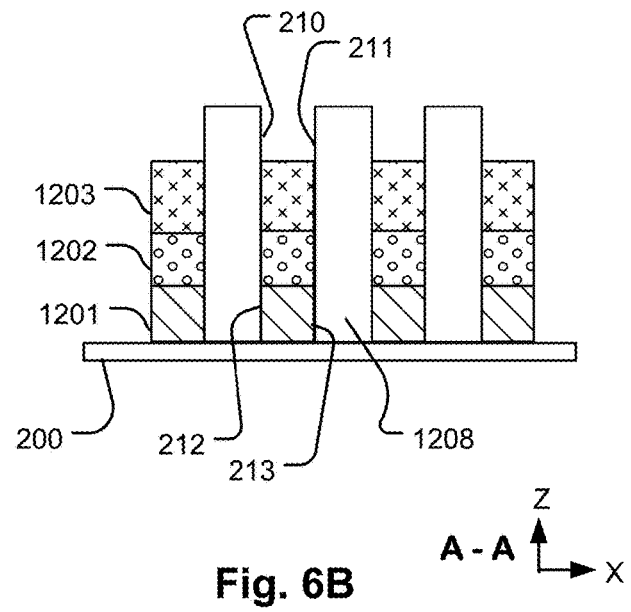

FIG. 6A is an aerial layout view of an X-Y plane, and FIG. 6B is a cross-section view of an X-Z plane along line A-A shown in FIG. 6A in a succeeding stage of the process. Referring to FIG. 6A, the aerial view reveals the lines of the conductive barrier material 1203 extending in the Y-direction, separated by lines of fill material 1208. FIG. 6B shows a cross-section taken along the line A-A shown in FIG. 6A of the structure that results from an etch process to remove the lines 1204 of hard mask material. As a result, recesses are formed between the lines of insulating fill material 1208 having sidewalls 210, 211 that are self-aligned with the sides 212, 213 of the lines of the first conductor 1201.

Figure 7A:
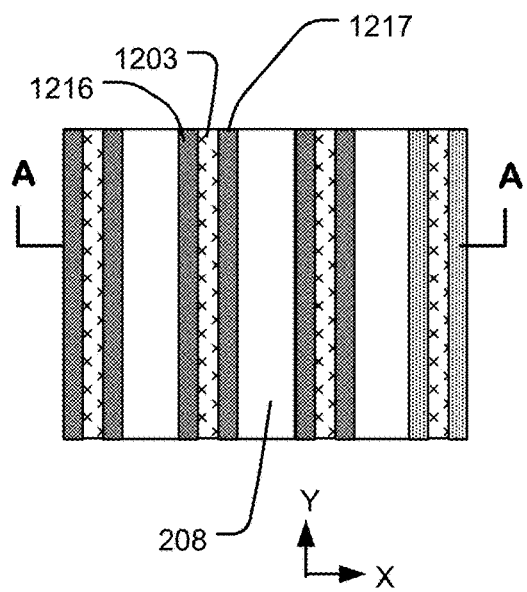
FIGS. 7A-7B are X-Y layout and X-Z cross-section views of a next stage in the example manufacturing process.
Figure 7B:
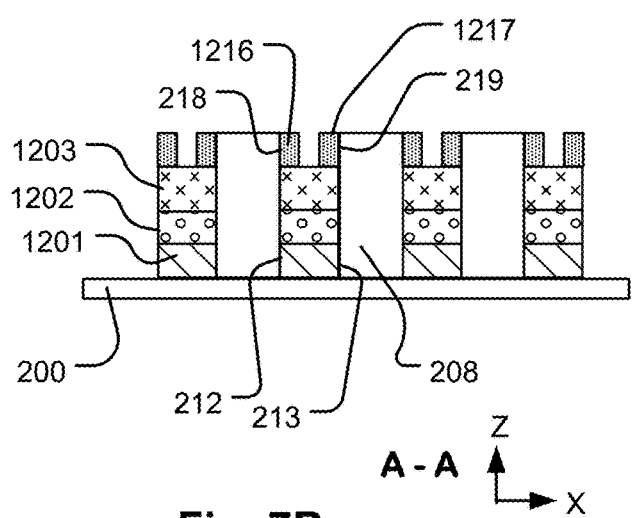

FIG. 7A is an aerial layout view of an X-Y plane, and FIG. 7B is a cross-section view of an X-Z plane along line A-A shown in FIG. 7A in a succeeding stage of the process. At this stage, spacer lines (e.g. 1216, 1217) are formed within the recesses by a blanket deposition of the confinement spacer material (silicon nitride) followed by anisotropic etching using an etch chemistry selected for the confinement spacer material over the fill material and the conductive barrier material, to remove the material over the flat top of the fill material 208 and the flat bottoms of the recesses, while leaving sidewall spacers as illustrated. Referring to FIG. 7A, the aerial view reveals sidewall confinement spacer lines 1216, 1217 of sidewall confinement spacer material with the underlying line of conductive barrier material 1203 exposed beneath the lines of sidewall spacer material. FIG. 7B shows a cross-section taken along the line A-A of FIG. 7A, of the structure that results from formation of the sidewall confinement spacer lines 1216, 1217. The sidewall confinement spacer lines 1216, 1217 are formed on the first pair of opposing sides of the lines, and have outside surfaces 218, 219 formed on the sides of the lines of fill material 208, and as a result are self-aligned with the recesses. Also, the sidewall confinement spacer lines 1216, 1217 can have top surfaces that are coplanar within practical limitations of the etching techniques with the top surfaces of the lines of fill material 208.

Figure 8A:
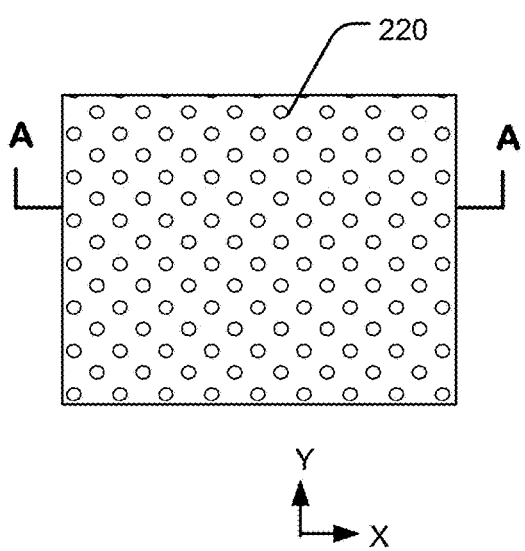
FIGS. 8A-8B are X-Y layout and X-Z cross-section views of a next stage in the example manufacturing process.
Figure 8B:
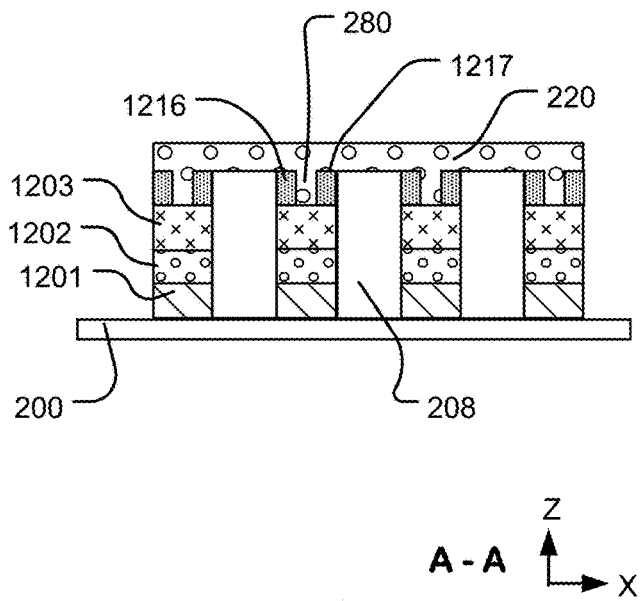

FIG. 8A is an aerial layout view of an X-Y plane, and FIG. 8B is a cross-section view of an X-Z plane along line A-A shown in FIG. 8A in a succeeding stage of the process. At this stage, a blanket layer 220 of phase change material is deposited over the structure. Referring to FIG. 8A, the aerial view shows the blanket layer 220 overlying the plurality of lines formed in the preceding stages. In FIG. 8B, the cross-section view taken on the line A-A shows phase change material including a body 280 of phase change material confined between the sidewall confinement spacer lines 1216, 1217 along the lines between the fill 208. Thus, the body 280 extends from the overlying blanket layer 220 of phase change material. During the deposition of the blanket layer 220, the composition of the phase change material layer can be changed as suits the particular implementation, so that there may be variations in the concentrations of the various elements through the depth of the structure.

FIG. 9A is an aerial layout view of an X-Y plane; FIG. 9B is a cross-section view of a Y-Z plane along line C-C shown in FIG. 9A; FIG. 9C is a cross-section view of an X-Z plane along line B-B shown in FIG. 9A; and FIG. 9D is a cross-section view of an X-Z plane along line A-A shown in FIG. 9A, in a succeeding stage of the process. At this stage, the manufacturing process has included deposition of a second stack of materials (best seen with reference to FIG. 9D) including materials of the second conductor layer, materials of a switch element in a switching layer, materials of a conductive barrier layer, and materials of a hard mask layer. Materials deposited can be the same as those discussed above in connection with FIG. 3, or variations on those materials as suits a particular embodiment. Also, the manufacturing process has included patterning the stacks to define the plurality of trenches stopping at the level of the first conductor 1201, between stacked lines, including second conductors 1222, lines 1223 of the switching layer, lines 1224 of the conductive barrier layer, and lines 1225 of the hard mask layer, best seen with reference to FIG. 9B. Referring to FIG. 9A, the aerial view reveals a plurality of first conductors 1201 extending in the Y-direction (at the bottom of the trenches), overlaid by a plurality of stacked lines having a line 1225 of hard mask material on the upper surface, extending in the X-direction.

FIG. 9B is a cross-section taken along the line C-C of FIG. 9A, revealing the structure of the X-direction stacked lines 1220, 1222, 1223, 1224, 1225 extending along the lines, and memory cell stacks self-aligned with the sides of the first conductors 1201, phase change material lines 1220, and second conductors 1222, as a result of the patterned etching. Memory cell stacks include elements 2202 and 2203 and the body 2280 of phase change material between spacers 2216, 2217 in the cylindrical volumes at crosspoints of the first conductor (1201), and the second conductor (1222).

FIG. 9C is a cross-section taken along the line B-B of FIG. 9A between the stacked lines, showing that the trenches stop on the upper surface of the first conductors 1201. FIG. 9D shows that as a result of this depth of etching, memory cell stacks (2216, 2280, 2217, 2203, 2202) are formed in the cylindrical volume at the cross-point between the second conductor 1222, and the plurality of first conductors 1201, while lines remain above the second conductor 1222.

FIG. 9D is a cross-section taken along the line A-A of FIG. 9A, along the stacked lines. In this cross-section, the confinement spacers 2216, 2217 of the memory cells in the first level of cells are illustrated, confining bodies 2280 of phase change material between the confinement spacers 2216, 2217, the bodies 2280 being an extension of the overlying lines 1220 of the phase change materials.

The deep etch at this stage can be separated into two etch steps with separate alignment masks to reduce the aspect ratio of the deep trenches for some embodiments. The first etch may be executed before deposition of the materials for lines 1223, 1224, 1225, and the second etch after deposition of the materials for lines 1223, 1224, 1225.

FIG. 10A is an aerial layout view of an X-Y plane; FIG. 10B is a cross-section view of a Y-Z plane along line C-C shown in FIG. 10A; FIG. 10C is a cross-section view of an X-Z plane along line B-B shown in FIG. 10A; and FIG. 10D is a cross-section view of an X-Z plane along line A-A shown in FIG. 10A, in a succeeding stage of the process. Referring to FIG. 10A, the aerial view reveals a blanket deposition of a thin film 228 of silicon nitride over the structure shown in FIGS. 9A-9D. FIG. 10B shows the thin film 228 lining the sides of the trenches, forming confinement liners 230, 229 on the sides of the line 1220 of phase change material and the first level of the stacks. FIG. 10C illustrates that the thin film 228 lines the bottom of the trenches. FIG. 10D illustrates the thin film 228 over the top of the stacked lines that extends in the X-direction.

FIG. 11A is an aerial layout view of an X-Y plane; FIG. 11B is a cross-section view of a Y-Z plane along line C-C shown in FIG. 11A; FIG. 11C is a cross-section view of an X-Z plane along line B-B shown in FIG. 11A; and FIG. 11D is a cross-section view of an X-Z plane along line A-A shown in FIG. 11A, in a succeeding stage of the process. At this stage, the process has included depositing an insulating fill material 235 between the lines, and applying a chemical mechanical polishing step or other planarizing step that stops on the upper surface of the silicon nitride thin film 228. Referring to FIG. 11A, the aerial view shows the lines extending in the X-direction covered by the thin film 228 of silicon nitride, separated by insulating fill material 235. FIG. 11B shows the structure with the insulating fill material 235 between the stacked lines, with an upper surface coplanar with the upper surface of the thin film 228. FIG. 11C illustrates the insulating fill material 235 fills the trenches between the lines. FIG. 11D shows the stacked lines extending in the X-direction in the upper level of the structure overlying the memory cell stacks in the cylindrical volumes at the cross-points.

FIG. 12A is an aerial layout view of an X-Y plane; FIG. 12B is a cross-section view of a Y-Z plane along line C-C shown in FIG. 12A; FIG. 12C is a cross-section view of an X-Z plane along line B-B shown in FIG. 12A; and FIG. 12D is a cross-section view of an X-Z plane along line A-A shown in FIG. 12A in a succeeding stage of the process. At this stage, the thin film 228 and hard mask line 1224 on the top of the patterned lines are pulled out by a selective etching process, leaving recesses 240 on the top of the stacked lines. The recesses 240 have sidewalls that are self-aligned with the sides of the insulating fill material 235 and, as a result, are self-aligned with some offset determined by the thickness of the thin film liners 228a, 228b, with the sides of the second conductors 1222. The remaining parts of the silicon nitride thin film include liners 228a, 228b on the sides of the insulating fill material 235 in the trenches, and contacting the first and second opposing sides of the body 2280 of phase change memory material in the memory cell stacks in the lower level of the structure. Referring to FIG. 12A, the aerial view shows the lines 1224 of the conductive barrier material and the liners 228a and 228b in the lines extending in the X-direction, with insulating fill material 235 between the lines. The recess 240 that results from removal of the silicon nitride hard mask lines 1224 and the thin film 228 on the top of the lines is best seen in FIG. 12B. FIG. 12C illustrates the insulating fill material 235 remains intact. The cross-section shown in FIG. 12D illustrates removal of the silicon nitride hard mask line 1224 and the thin film 228 over the top of the lines.

FIG. 13A is an aerial layout view of an X-Y plane; FIG. 13B is a cross-section view of a Y-Z plane along line C-C shown in FIG. 13A; FIG. 13C is a cross-section view of an X-Z plane along line B-B shown in FIG. 13A; and FIG. 13D is a cross-section view of an X-Z plane along line A-A shown in FIG. 13A in a succeeding stage of the process. At this stage, a manufacturing process has included formation of spacer lines 1241, 1242 within the recesses. The spacer lines 1241, 1242 can be formed by a blanket deposition of the confinement spacer material followed by anisotropic etching using an etch chemistry selected for the confinement spacer material over the fill material, and the conductive barrier layer, to remove the material over the flat top of the insulating fill material 235 and flat bottoms of the trenches beneath the insulating fill material 235, while leaving the lines 1241, 1242, of sidewall spacers. Referring to FIG. 13A the aerial view reveals lines of the sidewall confinement spacer lines 1241, 1242 with underlying conductive barrier material lines 1224 exposed beneath the lines of the sidewall spacer material. FIG. 13B illustrates the lines 1241, 1242 of confinement spacer material on the top of the conductive barrier lines 1224, and aligned with the sides of the insulating fill material 235 in the upper level of the structure. FIG. 13C shows the insulating fill material 235 between the lines. FIG. 13D is taken on a cross-section between the alignment spacers, and shows that the upper surface of the conductive barrier line 1224 is revealed between the spacers.

FIG. 14A is an aerial layout view of an X-Y plane; FIG. 14B is a cross-section view of a Y-Z plane along line C-C shown in FIG. 14A; FIG. 14C is a cross-section view of an X-Z plane along line B-B shown in FIG. 14A; and FIG. 14D is a cross-section view of an X-Z plane along line A-A shown in FIG. 14A in a succeeding stage of the process. At this stage, a blanket layer 245 of phase change material is deposited over the structure. Referring to FIG. 14A, the aerial view shows the blanket layer 245 overlying the plurality of lines formed in the preceding stages. In FIG. 14B, the cross-section view taken on line C-C shows the phase change material blanket layer 245 including a body 1246 confined between the spacer lines 1241, 1242 along the lines between the insulating fill material 235. Thus, the body 1246 extends in a line from the overlying layer of phase change material blanket layer 245. As mentioned above, during the deposition of the blanket layer 245, the composition of the phase change material can be changed as suits a particular implementation, so that there may be variations in the concentrations of various elements to the depth of the structure. FIG. 14C illustrates the layer 245 overlying the insulating fill material 235. FIG. 14D shows the layer 245 with the body 1246 extending on the side between the confinement spacer lines 1241, 1242, and in contact with the conductive barrier line 1224.

FIG. 15A is an aerial layout view of an X-Y plane; FIG. 15B is a cross-section view of a Y-Z plane along line C-C shown in FIG. 15A; FIG. 15C is a cross-section view of a Y-Z plane along line A-A shown in FIG. 15A; FIG. 15D is a cross-section view of an X-Z plane along line D-D shown in FIG. 15A; and FIG. 15E is a cross-section view of an X-Z plane along line B-B shown in FIG. 15A, in a succeeding stage of the process. At this stage, the process has included a blanket deposition of a hard mask material such as silicon nitride, and patterning the hard mask material to form lines 1248 extending in the Y-direction separated by trenches 250 that extend down to the second conductors 1222, thereby forming a second level of memory cell stacks in the cross-points between third conductors 1247 extending in the Y-direction and the second conductors 1222 extending in the X-direction. Referring to FIG. 15A, the aerial view shows the lines extending in the Y-direction covered by the hard mask material lines 1248, separated by trenches which reveal the upper surface of the second conductors 1222 that extend in the X-direction.

FIG. 15B illustrates third conductor 1247 extending in the Y-direction over memory cell stacks in first and second levels of the structure. FIG. 15C, which is rotated by 90° relative to FIG. 15B, illustrates that the second conductors 1222 extend in the X-direction orthogonal to the third conductors 1247 and the first conductors 1201 which extend in the Y-direction. Also, memory cell stacks are disposed in a first level between the first conductors 1201 and the second conductors 1222, and a second level between the third conductors 1247 and the second conductors 1222. The body 2281 of phase change material between the spacers 2241, 2242 extends within the cylindrical volume at the cross-point from the third conductor 1247, and has sides aligned with the sides of the third conductor 1247, as seen in FIG. 15C.

FIG. 15D illustrates that the trenches 250 formed extend between the lines extending in the Y-direction down to the upper surface of the second conductors 1222 which extend in the X-direction. FIG. 15E illustrates structures outside of the memory cell stacks, which are separated by the insulating fill material 235. This illustrates that the phase change material 1245 in this embodiment lines the underside of the third conductor 1247 along the conductor between the memory cell stacks.

FIG. 16A is an aerial layout view of an X-Y plane; FIG. 16B is a cross-section view of a Y-Z plane along line C-C shown in FIG. 16A; FIG. 16C is a cross-section view of a Y-Z plane along line A-A shown in FIG. 16A; FIG. 16D is a cross-section view of an X-Z plane along line D-D shown in FIG. 16A; and FIG. 16E is a cross-section view of an X-Z plane along line B-B shown in FIG. 16A, in a succeeding stage of the process. In this stage, the process has included a deposition of a thin film liner 251 of the silicon nitride or other confinement liner material over the structure, followed by applying an insulating fill 252 and planarizing the structure so that the upper surface of the insulating fill 252 is coplanar with the upper surface of the liner 251. Referring to FIG. 16A, the aerial view reveals lines extending in the Y-direction covered by the thin film liner 251 of silicon nitride or other confinement liner material separated by insulating fill 252. FIG. 16B shows the thin film liner 251 over the top of the lines extending in the Y-direction. FIG. 16C shows the liner 251 lining the sidewalls of the trenches aligned with the memory cell stacks, and confining the phase change memory material in the line 1245 and in the bodies 2281 for the stacks in the upper level of the structure. FIG. 16D shows the insulating fill 252 over the liner 251 in the trenches between the lines. FIG. 16E shows the liner 251 lining the trenches between the memory cell stacks.

In an alternative embodiment, making more levels of memory cell stacks, the process can include removal of the hard mask lines 1248, and planarizing the structure down to the upper surface of the third conductors 1247 to form a flat surface for continuing the formation of cross-point structures.

FIG. 16B and FIG. 16C show the structures of the memory cell stacks in first and second levels of the array. The memory cell stacks are similar except rotated by 90° relative to one another, so that the confinement spacers 2216, 2217 in the first level extend in the Y-direction and the confinement spacers 2241, 2242 in the second level extend in the X-direction.

The memory cell stacks in the first level include a body 2280 of phase change material between confinement spacers 2216 and 2217 on opposing sides of the memory cell stack that are aligned with the sides of the conductor 1201 which extends in the Y-direction. Also, in the first level of memory cell stacks, the body 2280 of phase change material between the confinement spacers 2216, 2217 is confined on a second pair of opposing sides by the insulating confinement liner 230, 231 that is aligned with the conductor 1222 which extends in the X-direction. In the second level, the memory cell stacks include a body 2281 of phase change material between confinement spacers 2241, 2242 (FIG. 16B) on opposing sides of the memory cell stack that are aligned with the sides of the conductor 1222 which extends in the X-direction. Also in the second level of memory cell stacks, the body 2281 of phase change material between the confinement spacers 2241, 2242 is confined on a second pair of opposing sides by the confinement liner 261, 262 (FIG. 16C—parts of the thin film liner 251) on the sidewalls.

Thus, as a result of the procedures described, a multilevel cross-point architecture is provided in which the memory cell stacks comprise confined bodies of programmable resistance material having cross-sectional areas that are substantially less than the cross-sectional area of the memory cell stacks in the cylindrical volume defined by the widths of the conductors at the cross-points.

For an embodiment like that shown in FIG. 2, with a pillar type memory element, the manufacturing flow is altered to add a CMP step or other planarizing step after deposition of the programmable resistance memory material as shown in FIGS. 8A and 8B, and as shown in FIGS. 14A-14D. This results in the body of programmable resistance memory material having an upper surface coplanar with the upper surfaces of the spacers as shown in FIG. 2. For this alternative, FIG. 17A is a cross-section view of a Y-Z plane along a line equivalent to line C-C shown in FIG. 16A, adjusted for the change; FIG. 17B is a cross-section view of an X-Z plane along a line equivalent to line B-B shown in FIG. 16A adjusted for the change. As shown in FIGS. 17A and 17B, the phase change material (2290, 2291) does not line the undersides of the conductors (1222, 1247) between the memory cell stacks in this embodiment.

Figure 18:
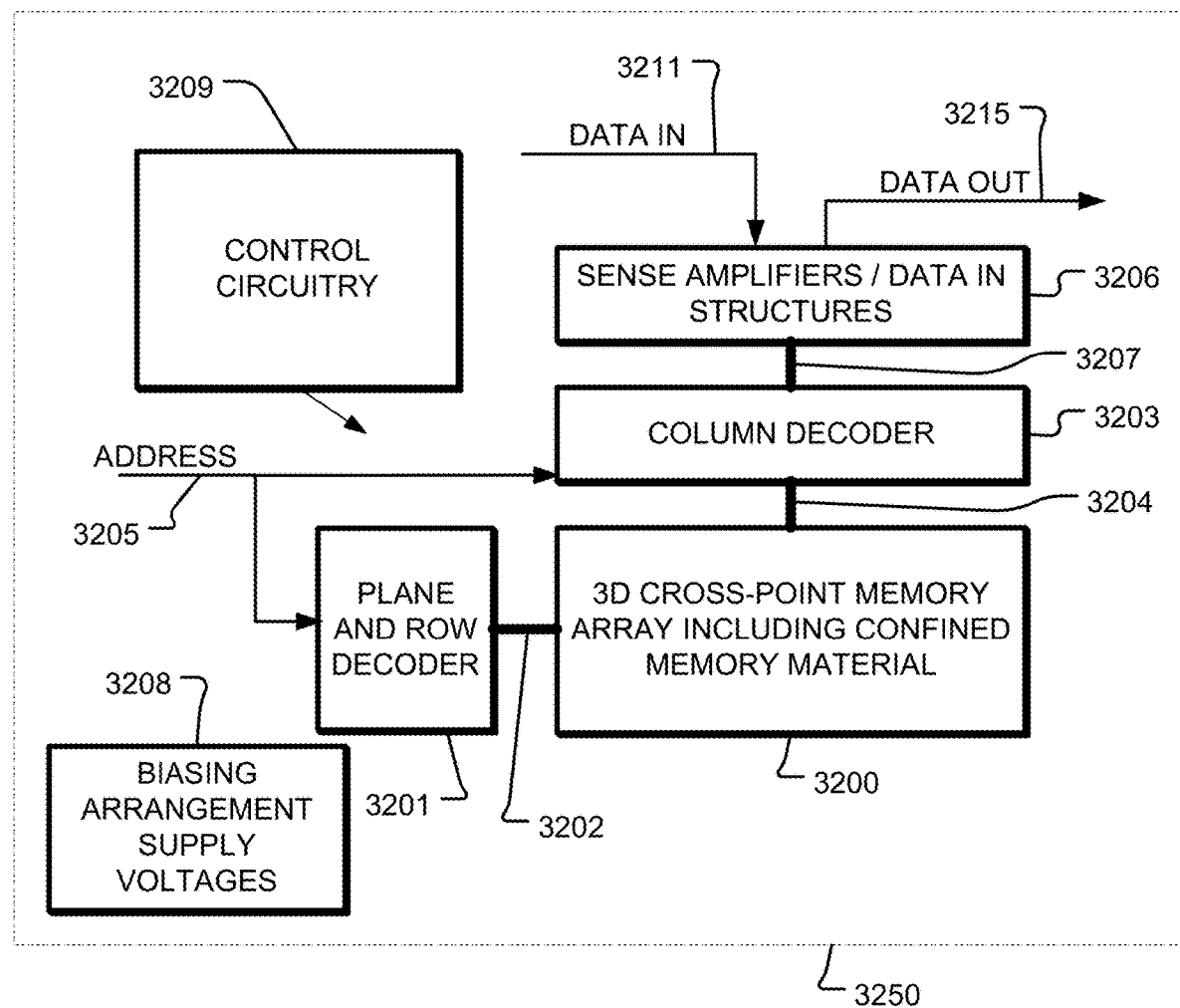
FIG. 18 is a block diagram of an integrated circuit with a 3D memory array having self-aligned 3D memory with confined cells, as described herein.

FIG. 18 shows an integrated circuit 3250 including a 3D memory array 3200 comprising memory cells including ovonic threshold switches in series with bodies of phase change material confined by confinement spacers as described herein. A plane and row decoder 3201 is coupled to, and in electrical communication with, a plurality of word lines 3202, and arranged along rows in the memory array 3200. A column decoder 3203 is coupled to, and in electrical communication with, a plurality of bit lines 3204 arranged along columns in the memory array 3200 for reading data from, and writing data to, the memory cells in the 3D memory array 3200. Addresses are supplied on bus 3205 to the plane and row decoder 3201 and to the column decoder 3203. Sense amplifiers and other supporting circuitry such as pre-charge circuits and so on, along with data-in structures in block 3206, are coupled to the column decoder 3203 via the bus 3207. Data is supplied via the data-in line 3211 from input/output ports on the integrated circuit 3250 or other data sources, to the data-in structures in block 3206. Data is supplied via the data-out line 3215 from the sense amplifiers in block 3206 to input/output ports on the integrated circuit 3250, or to other data destinations internal or external to the integrated circuit 3250. A bias arrangement state machine is in control circuitry 3209, controlling biasing arrangement supply voltages 3208, and the sense circuitry and the data-in structures in block 3206, for read and write operations. The control circuitry 3209 can be implemented using special purpose logic, a general purpose processor or a combination thereof, configured to execute the read, write and erase operations.

A cross-point memory architecture and memory cell structure is provided in which the phase change material, or other programmable resistance material can be confined by silicon nitride, or other confinement material on four sides, which remains self-aligned with the volume in the cross-points of the array. Also, the memory cell retention is improved, and reset current magnitudes can be reduced.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory, comprising:
   a plurality of first conductors in a first conductor layer having sidewalls extending in a first direction, and a plurality of second conductors in a second conductor layer having sidewalls extending in a second direction and crossing over the plurality of first conductors at cross-points having cross-point areas defined by widths of the first and second conductors;
   an array of memory cell stacks disposed in the cross-points between the first conductors and the second conductors, each memory cell stack in a corresponding cross-point in the array comprising:
      a switch element, a conductive barrier layer, and a memory cell in series, and having sides aligned within the cross-point area of the corresponding cross-point, the memory cell including confinement spacers within the cross-point area having outside surfaces on a pair of opposing sides of the stack, and a body of programmable resistance memory material confined between inside surfaces of the spacers; and
   a layer of the programmable resistance memory material lining the second conductors in the plurality of second conductors, and in contact with the bodies of programmable resistance memory material in the memory cell stacks, and separating the bodies of programmable resistance memory material from the second conductors at the corresponding cross-point.

2. The memory of claim 1, wherein each memory cell stack includes a layer of confinement material having outside surfaces on a second pair of opposing sides of the stack within the cross-point area at the corresponding cross-point.

3. The memory of claim 2, wherein the confinement spacers comprise silicon nitride, and the layer of confinement material comprises silicon nitride.

4. The memory of claim 1, the programmable resistance memory material comprising a phase change material.

5. The memory of claim 1, wherein the switch element comprises an ovonic threshold switch.

6. The memory of claim 1, the programmable resistance memory material comprising a phase change material, and the switch element comprising an ovonic threshold switch.

7. The memory of claim 1, wherein the confinement spacers comprise silicon nitride.

8. The memory of claim 1, including:
   a plurality of third conductors in a third conductor layer having sidewalls extending in the first direction, and over the plurality of second conductors at cross-points; and
   an array of memory cell stacks disposed in the cross-points between the second conductors and the third conductors.

9. A memory, comprising:
   a plurality of first conductors in a first conductor layer having sidewalls extending in a first direction, and a plurality of second conductors in a second conductor layer having sidewalls extending in a second direction and crossing over the plurality of first conductors at cross-points; and
   an array of memory cell stacks disposed in the cross-points between the first conductors and the second conductors, each memory cell stack in a corresponding cross-point in the array comprising:
      an ovonic threshold switch, a conductive barrier layer, and a memory cell in series, and having a first pair of opposing sides aligned with the sidewalls of the first conductor at the corresponding cross-point, and a layer of insulating material on a second pair of opposing sides aligned with the sidewalls of the second conductor at the corresponding cross-point, the memory cell including insulating spacers on the first pair of opposing sides and a body of phase change memory material confined between the spacers, the spacers having outside surfaces aligned with sidewalls of the first conductor at the corresponding cross-point; and
   a layer of the phase change memory material lining the second conductors in the plurality of second conductors, and in contact with the bodies of phase change memory material in the memory cell stacks, and separating the bodies of phase change memory material from the second conductors at the corresponding cross-point.

10. The memory of claim 9, wherein the insulating spacers comprise silicon nitride.

11. The memory of claim 9, wherein the insulating spacers comprise silicon nitride, and the layer of insulating material comprises silicon nitride.

12. The memory of claim 9, including:
a plurality of third conductors in a third conductor layer having sidewalls extending in the first direction, and over the plurality of second conductors at cross-points; and
a second array of memory cell stacks disposed in the cross-points between the second conductors and the third conductors.

13. A method of manufacturing an integrated circuit, comprising:
forming a plurality of first conductors in a first conductor layer having sidewalls extending in a first direction, and a plurality of second conductors in a second conductor layer having sidewalls extending in a second direction and crossing over the plurality of first conductors at cross-points having cross-point areas defined by widths of the first and second conductors; and
forming an array of memory cell stacks disposed in the cross-points between the first conductors and the second conductors, each memory cell stack in a corresponding cross-point in the array comprising:
a switch element, a conductive barrier layer, and a memory cell in series, and having sides aligned within the cross-point area of the corresponding cross-point, the memory cell including confinement spacers within the cross-point area having outside surfaces on a pair of opposing sides of the stack, and a body of programmable resistance memory material confined between inside surfaces of the spacers; and
forming a layer of the programmable resistance memory material lining the second conductors in the plurality of second conductors, and in contact with the bodies of programmable resistance memory material in the memory cell stacks, and separating the bodies of programmable resistance memory material from the second conductors at the corresponding cross-point.

14. The method of claim 13, including:
forming a plurality of third conductors in a third conductor layer having sidewalls extending in the first direction, and over the plurality of second conductors at cross-points; and
forming a second array of memory cell stacks disposed in the cross-points between the second conductors and the third conductors.

15. The method of claim 13, wherein forming the plurality of first conductors, the plurality of second conductors and the memory cell stacks, comprises:
forming a first stack of materials, including a layer of materials of the first conductors, a layer of materials of the switch element, a layer of materials of the conductive barrier and a sacrificial layer;
etching first trenches through the first stack to a level below the layer of materials of the first conductors in a pattern defining the sidewalls of the plurality of first conductors;
forming an insulating fill in the first trenches to a level coplanar with an upper surface of the sacrificial layer;
removing the sacrificial layer to form a plurality of second trenches aligned with sidewalls of the plurality of first conductors, and exposing the layer of materials of the conductive barrier;
forming insulating spacers on opposing sides of the second trenches to provide more narrow trenches within the plurality of second trenches;
depositing programmable resistance memory material in the more narrow trenches;
forming a layer of materials of the second conductors to provide a second stack; and
etching third trenches through the second stack to a level below the layer of materials of the switch element in a pattern to define the plurality of second conductors, and the opposing sides of the memory cells stacks aligned with the sidewalls of the second conductors.

16. The method of claim 15, including:
before etching the third trenches, forming a second layer of materials of the first conductors, a second layer of materials of the switch element, a second layer of materials of the conductive barrier and a second sacrificial layer;
etching the third trenches;
forming an insulating fill in the third trenches to a level coplanar with an upper surface of the second sacrificial layer;
removing the second sacrificial layer to form a plurality of fourth trenches aligned with sidewalls of the plurality of second conductors, and exposing the second layer of materials of the conductive barrier;
forming second insulating spacers on opposing sides of the fourth trenches to provide second more narrow trenches within the plurality of fourth trenches;
depositing programmable resistance memory material in the second more narrow trenches;
forming a layer of materials of third conductors to provide a third stack; and
etching fifth trenches through the third stack to a level below the second layer of materials of the switch element in a pattern to define a plurality of third conductors, and opposing sides of a second array of memory cell stacks aligned with the sidewalls of the third conductors.

17. The method of claim 15, including forming an insulating liner in the first trenches.

18. The method of claim 15, wherein depositing programmable resistance memory material in the more narrow trenches, includes forming the layer of the programmable resistance material beneath the layer of materials of the second conductors.

19. The method of claim 13, the programmable resistance memory material comprising a phase change material.

20. The method of claim 13, wherein the switch comprises an ovonic threshold switch.

* * * * *